US006998033B2

(12) United States Patent
Lawson et al.

(10) Patent No.: US 6,998,033 B2
(45) Date of Patent: Feb. 14, 2006

(54) SPUTTERING CATHODE ADAPTER ASSEMBLY AND METHOD

(75) Inventors: John Lawson, Chandler, AZ (US); Dale Irwin, Mesa, AZ (US); Steve Chervenak, Phoenix, AZ (US); John McIntee, Gold Canyon, AZ (US)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 10/438,304

(22) Filed: May 14, 2003

(65) Prior Publication Data
US 2004/0020759 A1 Feb. 5, 2004

Related U.S. Application Data

(60) Provisional application No. 60/380,363, filed on May 14, 2002.

(51) Int. Cl.
*C23C 14/34* (2006.01)
(52) U.S. Cl. .............................. 204/298.11; 204/192.1; 204/192.12
(58) Field of Classification Search ............. 204/192.1, 204/192.12, 298.11
See application file for complete search history.

(56) References Cited

U.S. PATENT DOCUMENTS

| 4,909,695 A | 3/1990 | Hurwitt et al. ............. 414/217 |
| 4,915,564 A | 4/1990 | Eror et al. .................. 414/217 |
| 5,516,732 A | 5/1996 | Flegal ........................ 437/250 |
| 5,738,770 A | 4/1998 | Strauss et al. ......... 204/298.12 |
| 2003/0146084 A1 * | 8/2003 | Fu ............................ 204/192.2 |
| 2003/0168168 A1 * | 9/2003 | Liu et al. ................. 156/345.3 |

FOREIGN PATENT DOCUMENTS

| WO | WO 96/36065 | 11/1996 |
| WO | WO 00/77273 | 12/2000 |

* cited by examiner

Primary Examiner—Steven Versteeg
(74) Attorney, Agent, or Firm—Wood, Herron & Evans, L.L.P.

(57) ABSTRACT

An adapter assembly is provided for supporting a sputtering cathode in a fixed opening in the chamber of a sputter coating machine. The assembly includes: one of several adapter bodies, each configured to support, in the fixed opening, a target of one of a plurality of sizes and types, and at one of several target-to-substrate spacings; one of several insulator rings, each for a target of a different size or type; one of several dark-space shields, each for a target of a different size, type, material, or processing pressure; and one of several adapter shields, each for a different adapter body and target material. Only the shields accumulate deposits and require cleaning or replacement. The dark-space shield is spaced from the target rim by a gap of at 0.045 to 0.067 inches to form a deep narrow space that prevents deposits onto the insulator ring while avoiding arcing and plasma formation in the gap. A method is provided for existing sputtering machines with the assembly, which accommodates different targets and processes.

44 Claims, 20 Drawing Sheets

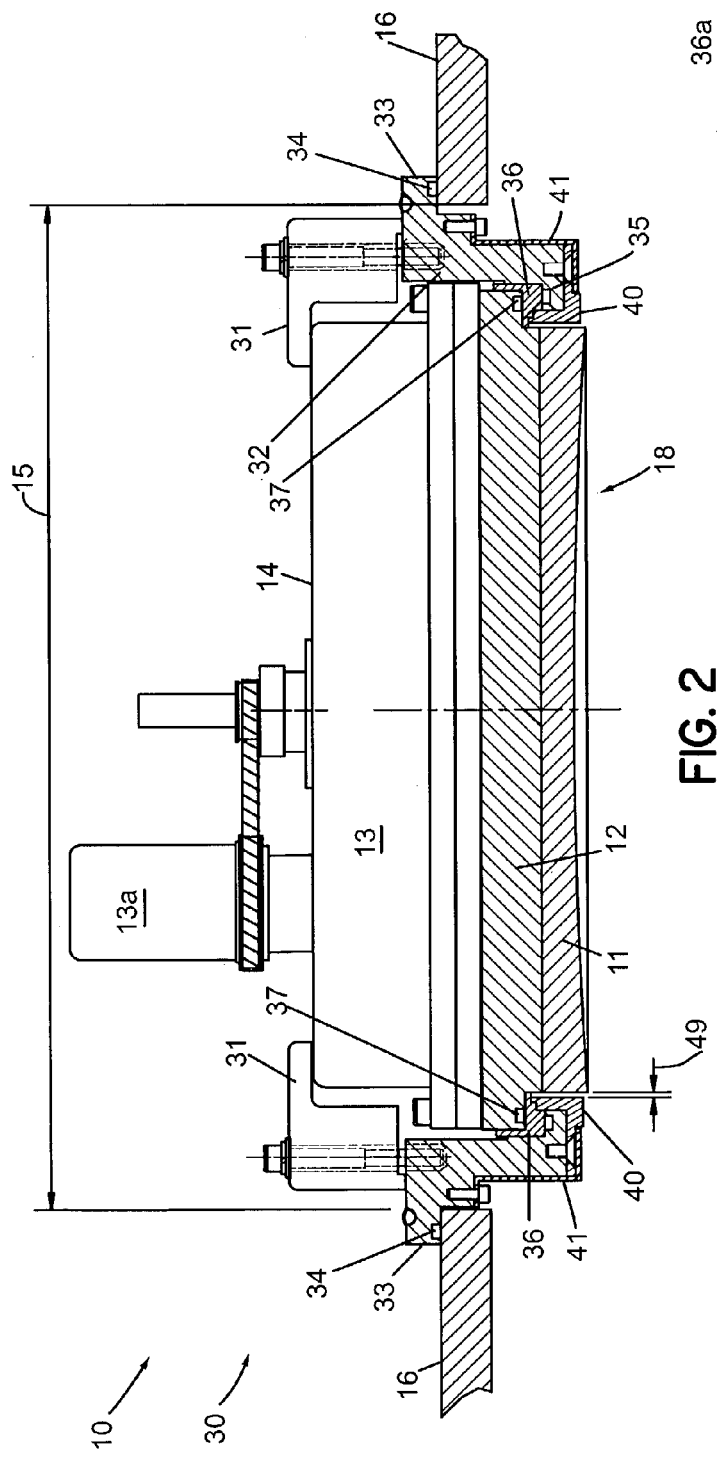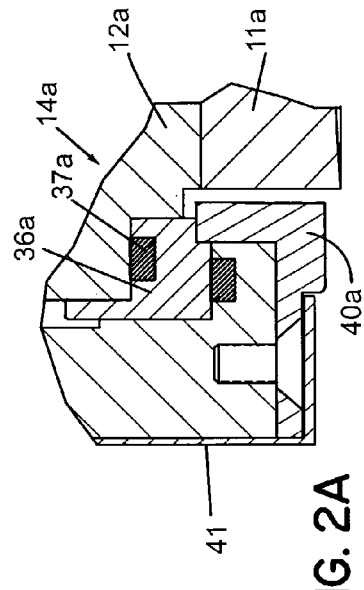
FIG. 2
FIG. 2A

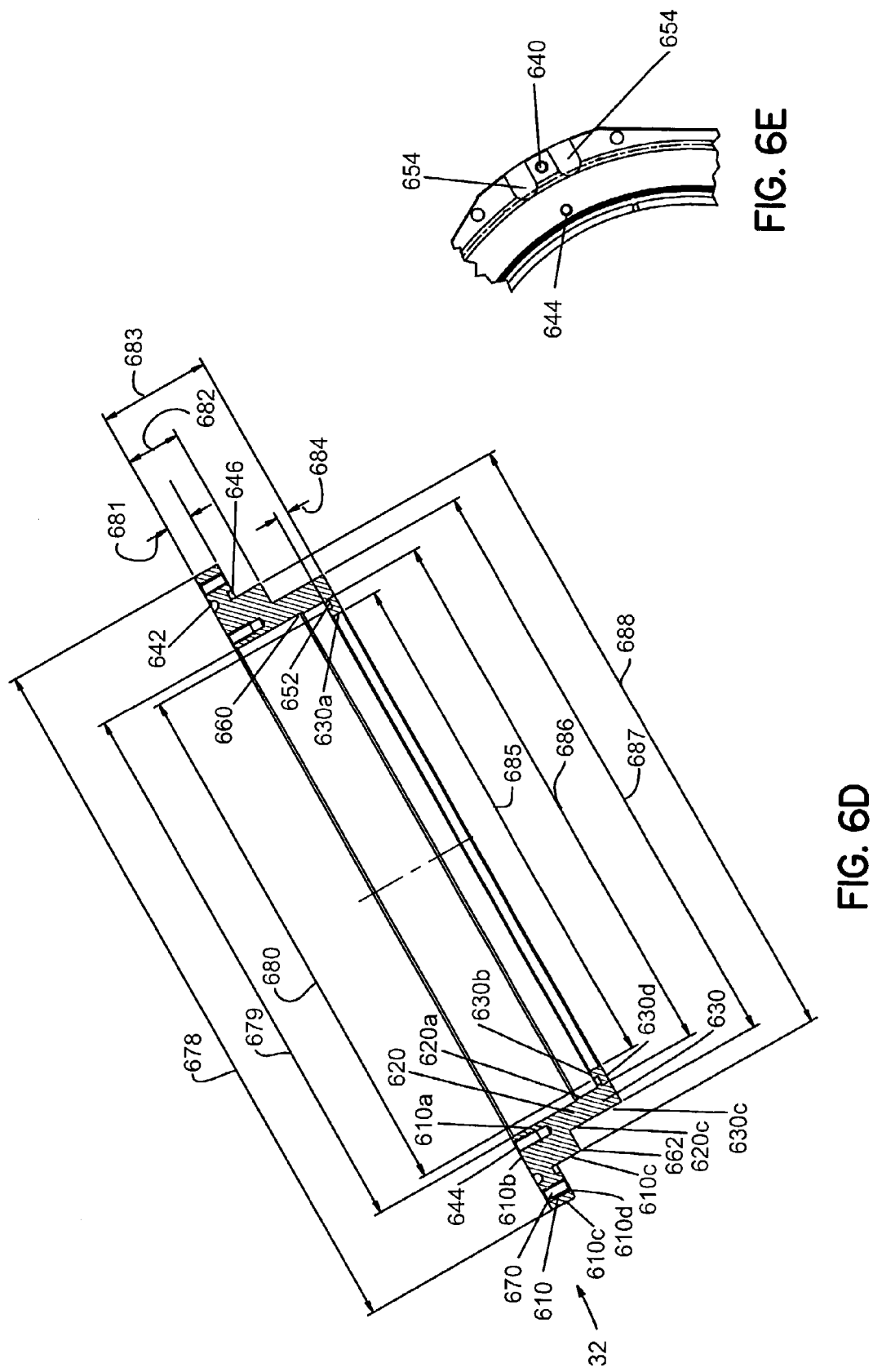

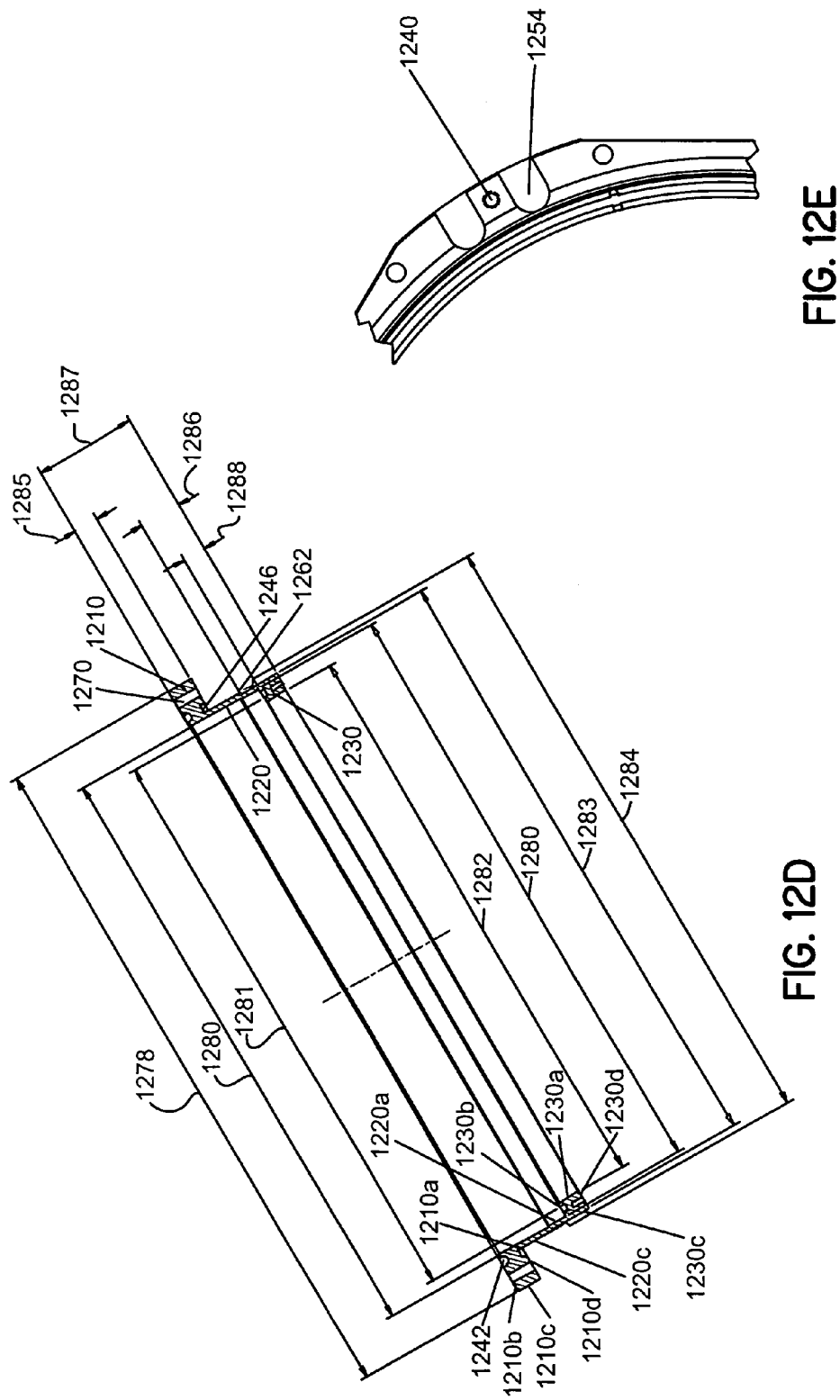

SPUTTERING CATHODE ADAPTER ASSEMBLY AND METHOD

This application claims priority to U.S. Provisional Patent Application Ser. No. 60/380,363, filed May 14, 2002.

FIELD OF THE INVENTION

This application relates to the mounting of sputtering cathode assemblies in wafer processing machines, particularly those of the type described in U.S. Pat. Nos. 4,909,695; 4,915,564 and 5,516,732, each hereby expressly incorporated herein by reference. Machines of this type are marketed under the trademarks ECLIPSE, ECLIPSE MARK II and ECLIPSE STAR by Applicant's assignee, Tokyo Electron Limited. These machines have vertical plenums in which an index plate rotates to carry wafers in a plurality of wafer holders spaced around the plate to each of a corresponding plurality of processing chambers. The application particularly relates to the mounting of sputtering cathode assemblies in sputter deposition chambers of such machines.

BACKGROUND OF THE INVENTION

Sputter coating machines, particularly those of the type identified above, are used in the manufacture of semiconductors. During a semiconductor manufacturing process, such machines sputter a thin layer, often of metal, onto a substrate, typically a semiconductor wafer of silicon or some other semiconductor material. The material that forms the deposited layer is supplied by ion bombardment of a target. Many types of targets are used in the same machines depending on the process to be performed and the semiconductor makers other requirements. Such targets are sometimes formed of a solid piece of sputtering material while others are formed of a mass of sputtering material bonded to a backplate. Targets of any of more than one size may usually be used in the same chamber of a sputtering machine. For example, in the machines referred to above, targets having nominal diameters of ten inches and twelve inches are available. While ten inch targets for these machines are typically 10.000+/−0.005 inches in diameter, nominal twelve inch targets are actually 11.625+/−0.005 inches in diameter. These targets are approximately one inch thick, which thickness declines over the life of the target as the sputtering material is consumed in the course of coating a large number of wafers, typically several thousand.

Sputtering targets of the vertical plenum machines referred to above are part of a sputtering cathode subassembly that mounts in an opening in the wall of a sputtering chamber in such machines. A sputtering surface of the target lies in the sputtering chamber and faces a semiconductor wafer that is to be coated with the material of which the sputtering surface of the target is formed. At the back of the target is fixed a magnet assembly that forms a magnetic field over the surface of the target to confine and enhance a plasma from which ions of gas for sputtering the target originate. In the machines referred to above, this magnet assembly typically includes an array of magnets that rotate behind the target. The provision of targets of two sizes (ten and twelve inch) and of two types (solid and backed) produces cathode assemblies for each of four distinct dimensional configurations for the same chamber of the machine.

The vertical plenum sputtering machines of the type identified above are high speed machines that cycle wafers through a series of processing stations by rotating wafer holders on an index plate in a vertical plane. The efficiency of such machines is in part due to indexing of the wafers in a fixed processing plane among the plurality of processing stations. Different processes, however, call for different target-to-wafer spacings. As a result, each of the four target configurations described above must be adapted to two or three different mounting positions in the chambers of the processing machine. This requires a variety of alternative adapter configurations so that any of the targets can be properly installed in the machine chamber for the performance of the various processes at the different target-to-wafer spacings.

In operation, the one of the cathode assemblies that is installed in a processing chamber of the machine has applied electrical power to it in the course of performing the sputtering process. This necessitates the insulating of the cathode assembly from the grounded wall of the machine. Annular insulators are used between the target or cathode assemblies and the machine housings, typically around the insides of the mounting adapters that hold the cathode assemblies in cathode mounting openings provided in one side of the chamber.

When the cathode assembly is installed in the processing chamber of a machine, the target surface faces a wafer holder for the semiconductor substrate across the chamber of the machine. During the sputtering process, electrical power and a negative charge are applied to the target, which causes gases in the chamber to become ionized to form a plasma and the negatively biased target to be bombarded with positive ions from the plasma. The bombarding causes atoms of the target material to be dislodged from the target, which then become mixed with the atoms of gases within the chamber. The object of the sputter coating process is to coat the wafer with the sputtered atoms of target material. However, the process also coats other surfaces facing the target as well as chamber component surfaces facing the gases within the chamber that scatter the sputtered atoms of material onto other surfaces. These surfaces include surfaces around the target and the mounting structure that holds the target in the opening in the chamber wall. Surface finishes and temperature gradients of surfaces in the chamber also affect the tendency for sputtered material to build up on these surfaces.

During the sputtering process, the material being sputtered builds up at specific areas on surfaces within the chamber. The buildup can cause spikes of coating material to form on these surfaces and create an icicle-like structure that can cause arcing and electrical shorts. The arcing can eventually cause the equipment to detect an electrical error condition and power down. This requires opening of the chamber and the possible loss of an expensive partially processed wafer. The buildup can also cause material to flake off of the parts during the sputtering process and to light upon and contaminate the semiconductor wafers being processed. Such contamination on the wafer surfaces can adversely affect the operation of the semiconductor devices or integrated circuits being made on the wafer. Such buildups require the stopping of the equipment and the cleaning of the chambers, resulting in a loss of productivity of expensive manufacturing assets.

One particular area where coating buildup can occur is on the surface of the insulator between the target or cathode assembly and the grounded mounting structure surrounding the cathode. Buildup of coating material, particularly where that material is metal, can cause a shorting of the power from the cathode to the grounded frame of the machine, which can cause damage and down time to the equipment and loss of wafers in the chambers of the machine.

FIG. 1 illustrates a target assembly 17 of an ECLIPSE type machine 10, discussed above, which includes a target 11 formed of a mass of sputter coating material and bonded to a metal backing plate 12. The backing plate 12 is secured to a rotating magnet assembly 13 to form an assembled cathode assembly 14. The cathode assembly 14 is mounted in a fixed size opening 15 in the door 16 of a chamber 18 of the processing apparatus 10, in which chamber 18 is a semiconductor wafer (not shown) mounted parallel to the target 11 for processing. An adapter ring 20, configured to support the specific target assembly 17 in the opening 15, is sealed to the chamber door 16 around its outer rim. The adapter 20 has an inner opening 21 in which the target assembly 17 is situated. An annular electrical insulator 22 is situated in the opening 21 and sealed to both the rim of the target assembly 17 and the adapter 20, as illustrated in FIG. 1A. A certain tolerance or spacing 23 around the insulator 22 is typical to accommodate the target assembly 17. The adapter 20 supports a grounded annular dark space shield 25 around the perimeter of the target 11.

During a sputter coating process, target material from the target 11 enters an annular space 26 between the rim of the target 11 and the adapter 20, and forms deposits 27 on the surfaces of the dark space shield 25 and the insulator 22. Plasma also can form in this space 26, which can sputter material from the edge of the target and re-sputter the deposited material 27 and redistribute it further into the space 26. A coating of conductive material 27 can eventually build up on these surfaces, including the surface of the insulator 22, thereby forming an electrically-conductive path 28 between the target assembly 14 and the grounded adapter ring 20, causing a current path through which power on the target assembly 14 can short to ground. This damaging occurrence has been avoided in this prior art structure by interrupting the operation of the machine 10 on one or more occasions during the life of a target and removing the adapter 20 and insulator 22 for replacement and cleaning. This interruption results in machine down-time and increases the cost of semiconductor wafers manufactured with the machine 10.

There is a need to improve the efficiency and reduce the costs of semiconductor wafer manufacture by solving the problems discussed above.

SUMMARY OF THE INVENTION

An objective of the present invention is to improve the efficiency and reduce the overall cost of semiconductor wafer sputter coating processes. A particular objective of the invention is to facilitate the operation of a sputter coating machine for the life of a target without the need to interrupt the operation to remove, clean or replace cathode assembly insulators or mounting adaptors due to buildup of deposits.

A further objective of the invention is to reduce the cost of servicing sputter coating machines and of configuring such machines with targets and target assemblies of various types.

A particular objective of the present invention is to accomplish the above objectives for sputtering machines of the ECLIPSE type.

According to the principles of the present invention, an adapter assembly system is provided for mounting targets of differing types in a semiconductor wafer processing machine, and particularly in a sputter coating machine of the ECLIPSE type.

According to certain principles of the invention, an adapter assembly is provided for a sputtering target that is configured in relation to the sputtering cathode assembly of which the target is a part to prevent deposition of coating material during the life of a target to a degree that would require service of the insulator to avoid shorting of power from the target or arcing across the insulator.

According to further principles of the invention, an adapter assembly system is provided with a limited number of alternative parts that allow a mounting adapter for more than one sputtering cathode to be assembled with a reduced number of parts and in such a way that parts that receive deposits can be economically replaced and reconditioned.

According to certain embodiments of the invention, an adapter assembly system is provided with alternative adapter bodies to accommodate targets of different sizes or shapes and for processes requiring different target-to-wafer spacings. The system is further provided with alternative dark space shields, alternative removable adapter shields and alternative insulator rings, which provide a small number of combinations of parts and economically accommodate different target and process combinations.

In accordance with specific embodiments of the invention, specific adaptor solutions are provided for specific target and machine applications, according to the geometrical configurations set forth in detail below.

According to one method of the present invention, an adapter is provided with geometry that properly positions a target and cathode assembly in a sputter deposition chamber relative to a position of a wafer to be processed. Different adapter geometries are provided to properly position different targets of different sizes or configurations or materials in a fixed opening or other cathode mounting structure of the processing chamber.

Further according to methods of the invention, the adapters are provided with adapter shields or cladding that can be removed, cleaned or replaced, which allows the body of the adaptor to be directly reused by shield replacement, minimizing the need to replace or clean the adaptor body.

Also according to methods of the invention, adapter ring geometries are provided to accommodate targets of different diameters in different target-to-wafer spacings, each of which of the geometries will accommodate different target types. Further, alternative ring insulators are provided of different insulator configurations, which have the capability of adapting targets or cathode assemblies of different types to the same adaptor bodies.

Further according to methods of the invention, dark space shields are provided that are dimensioned for use with targets of corresponding dimensions so as to provide a deep narrow space between the shield and the target having a width that will avoid the generation of plasma in the narrow space and reduce the likelihood of sputtered material from passing through the narrow space and onto the surface of the insulator that separates the target and cathode assembly from the chamber or adapter structure in which the target and cathode assembly are mounted. This width is related to pressure according to Paschen's Law. In accordance with the invention, the chamber is capable of being operated and is operated for the life of the target, without interruption of the operation for the purpose of removing deposits that might otherwise cause arcing or shorting at the insulator. The provision of dark space shields of different internal diameters enhances this capability.

According to methods of the present invention, different combinations of adapter bodies, adapter shields, insulator rings and dark space shields are provided and are capable of being used to adapt a variety of targets-to-wafer processing machines, particularly those of the ECLIPSE type, with a minimum of parts consistent with the minimum overall cost of ownership and operation of the machine.

The system and method according to the present invention is capable of providing an upgrade adapter assembly to be used for installing a magnetron cathode assembly particularly useful in machines such as those of the ECLIPSE type identified above. The adapter is a reusable metal part that facilitates the installation of the cathode assembly with its target into a standard mounting opening in the processing chamber of the machine. The assembly provides protective shielding of parts within the sputtering chamber to alleviate electrical shorting and contamination during the sputtering process, and to reduce the need to interrupt the operation of such machines for cleaning. The adapter assemblies of the system also set the required target-to-wafer spacing for different sputtering processes. The adapters of the system are equipped with water cooling for temperature control.

The invention provides for the use of a single sputter coating chamber with different targets and target mounting parameters using an economical set of parts for adapting the chamber to the target. Interruption of the operation of the chamber for cleaning is less frequent and requires changing or cleaning of the least expensive parts. The likelihood of spark discharge around the target and compromise of the insulators is reduced.

These and other objectives and advantages of the invention are more fully set forth in the following detailed description of the drawings.

BRIEF DESCRIPTION OF THE DRAWINGS

FIG. 2 is a cross-sectional diagram illustrating a sputtering cathode assembly installed in a processing chamber with adapter hardware according to one embodiment of the present invention for use with a type of target designated herein as type RM.

FIG. 2A is an enlarged drawing of a portion of FIG. 2 illustrating the cross-sectional diagram illustrating a sputtering cathode assembly installed in a processing chamber with adapter hardware according to one embodiment of the present invention for use with an alternative type of target designated herein as type SPA.

FIGS. 6A–6E, 6G and 6H show schematic views of an adapter body in accordance with an embodiment of the invention.

FIGS. 12A–12G show schematic views of another adapter body in accordance with an embodiment of the invention.

DETAILED DESCRIPTION OF THE DRAWINGS

Figure 1:
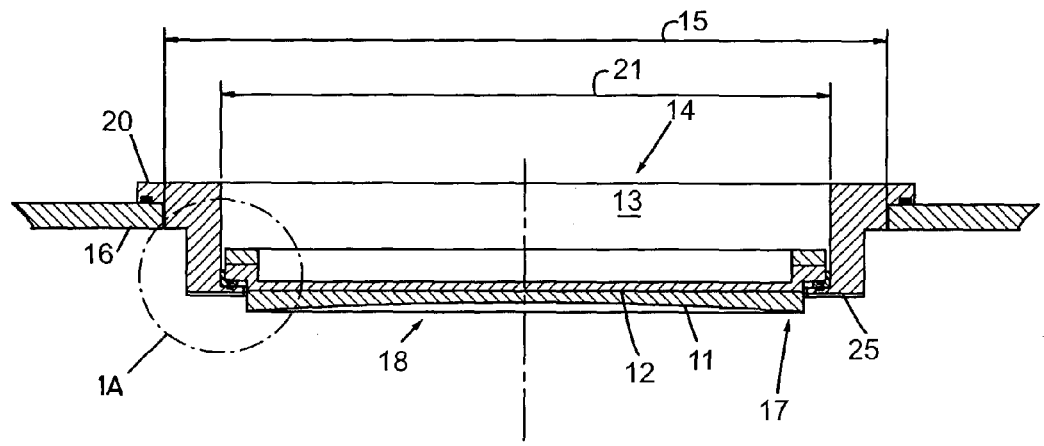
FIG. 1 is a cross-sectional diagram illustrating a sputtering cathode assembly installed in a processing chamber with adapter hardware of the prior art.
Figure 1A:
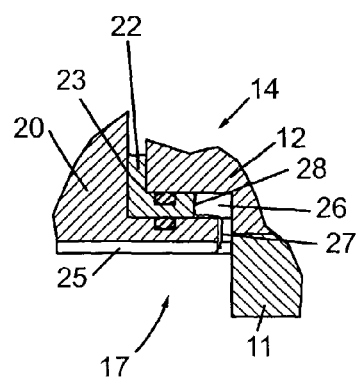
FIG. 1A is an enlarged view of the encircled portion of FIG. 1 designated 1A.

In FIG. 2, the cross section of an improved sputtering cathode assembly 14, such as shown in FIG. 1 and designated herein as the RM type, is illustrated. The cathode assembly 14 includes a target 11 bonded to a metal backing plate 12 that is secured to a rotating magnet assembly 13 to form the assembled cathode assembly 14. The cathode assembly 14 is held by clamps 31 in an adapter assembly 30 which supports the cathode assembly 14 in a fixed size opening 15 in the door 16 of a chamber 18 of a processing apparatus. The adapter assembly 30 includes a combination of parts configured to support a specific target 11 and cathode assembly 14 in the opening 15, sealed to the chamber door 16 around the rim of the opening 15.

The adapter 30 is formed of an annular adapter body 32 to which the clamps 31 are attached. The body 32 has an outer flange 33 that carries a seal 34 that seals to the door 16 around the opening 15 and has an inner shoulder 35 on which rests an annular insulator 36. The cathode assembly 14 is held against the insulator 36 by the force of the clamps 31. Both the adapter body 32 and the target assembly 14 are provided with seals that contact and seal against the insulator 36. The portion of the cathode assembly 14 that seals against the insulator is an outwardly extending flange on the back of the target 11, in this case on the backing plate 12 to which the target 11 is bonded, which has a seal 37 in a groove in the flange of the backing plate.

To accommodate target assemblies 14 for different size targets in the opening 15, adaptor bodies 32 of different configurations are provided. For example, to accommodate both standard nominal ten inch and nominal twelve inch targets, two alternative adaptor bodies 32 are provided. Further, different types of targets 11 of the same size are accommodated. For example, in FIG. 2, a target 11 having a backing plate 12 is illustrated. A target of this type is referred to herein as a type RM target, being designed for a rotating magnet type cathode assembly of the type illustrated in FIG. 2, which includes a rotating magnet assembly 13, which is driven by a drive motor 13a. Alternatively, a target 11a of a cathode assembly 14a, illustrated in the inset enlarged drawing of FIG. 2A, is a single piece aluminum target that has an integral flange 12a on which is supported an insulator 36a of an alternative configuration for fitting against the different target 11a. The insulator 36a has a seal 37a in a groove in the back of the insulator 36a that seals against the flange 12a at the back of the target 11a.

An annular dark space shield 40 is fixed to the adapter body 32, as illustrated in FIG. 2. A dark space shield 40a of a slightly different configuration than the shield 40 is provided for the target 11a, as illustrated in FIG. 2A. The differences between the dark space shields 40 and 40a are dictated by the differences in the targets 11 and 11a and the respective differences that they impose on the insulators 36 and 36a. An adapter shield 41 is also provided to cover the adapter body 32 to protect from deposits and the effects of the plasma. The adapter shield 41 clads the outside of the body 32 and can be removed for cleaning or replacement. The body 32 is otherwise reusable.

Figure 3:
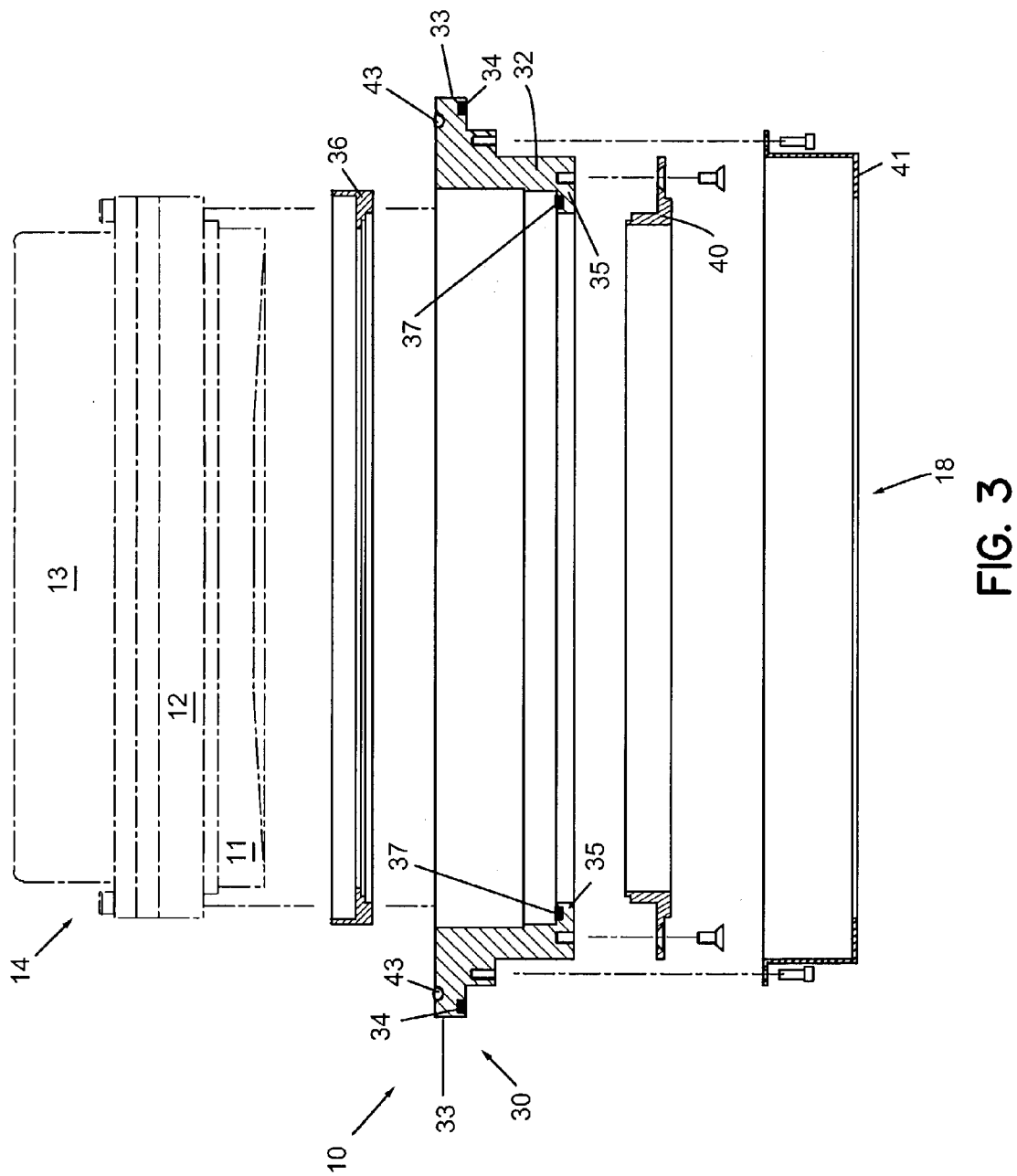
FIG. 3 is a disassembled cross-sectional drawings of the assemblies of FIGS. 2 and 2A respectively.

FIG. 3 illustrates the parts of the adapter assembly 30 in more detail for RM and SPA type targets 11, 11a respectively. The insulators 36, 36a are preferably fabricated of "Virgin TEFLON" PTFE Grade 7A or 8, which provides electrical insulation between the target 11, 11a, which is energized by a cathode power supply (not shown), and the adaptor assembly 30, which is grounded to the machine ground. The target and cathode assembly 14 operates at a negative potential, so that the insulation must be maintained for the sputtering process and for safety.

The body 32 of the assembly 30 is preferably fabricated from aluminum 6061-T6, which provides the interface for mounting the cathode assembly and target to the apparatus. As illustrated in FIG. 3, the body 32 has a copper cooling tube 43 in thermal contact therewith for water cooling and temperature control of the adapter body 32. The cathode assembly 30 is secured to the apparatus with four clamps (e.g., 31 in FIG. 2) that are made of, for example, a phenolic material to further electrically isolate the cathode assembly 14 from the adapter body 32.

The dark space shield 40,40a is fabricated from non-magnetic 316L stainless steel or aluminum 6061-T6/T651, depending on the sputtering process to be run. Dark space shields of these and other alternative materials may be provided for each of the configurations for shields 40,40a, depending on the processes for which each is required. During fabrication of the dark space shields 40,40a, the surfaces of the shields 40,40a that will be in the line-of-site of the target 11,11a are abrasive blasted or otherwise roughened to insure that what deposits occur on those surfaces are less likely to flake off during processing.

Various components of the adapter shield assembly 30 and other parts in the chamber 18 (FIG. 2) receive deposition of material from the target. Such material can build up and eventually flake off if the part does not have a good base coating. Flaking can cause contamination within the process chamber and on the substrate surface. Surface treatment such as abrasive blasting better allows the material deposits to adhere to the parts and form a desired base coating. Eventually, all parts in the line-of-site of the target will require cleaning and re-abrasive blasting or replacement.

Tolerances on dimensions of the dark space shields 40,40a should be tightly controlled to control the space between the dark space shield and the target 11,11a. This might require the stocking of alternative dark space shields 40,40a if the tolerances on the outer target diameters vary. These tolerances affect the spacing or gap 49 between the target 11,11a and the dark space shield 40,40a. The spacing between the target 11,11a and the dark space shield 40,40a should be small enough to insure that plasma does not form within this gap 49. For example, when running standard pressure sputtering processes, typically in the range of 2.0 to 3.0 milli-Torr, the space between the dark space shield and the target should be held to within a dimension of 0.062+/−0.005 inches; when running a high pressure sputtering process, e.g., 10.0–15.0 mTorr, the space should be held to within 0.050+/−0.005 inches. The spacing 49 should include allowances for tolerances of +/− 0.005 inches on the dark space shield and +/−0.005 inches on the target. When the spacing 49 is not kept small enough to prevent plasma from forming between the target and the dark space shield, extreme deposition and icicle-like deposits can form that can cause the undesirable electrical arcing and shorting referred to above. For general purposes, the gap 49 should not be less than 0.045 inches. The maximum gap 49 is less consequential and greater deviations from the maximums can be somewhat tolerated. These considerations can be used if it is necessary to use a single dark space shield for the entire operating pressure range.

Dark-space shields dimensioned for the specific pressure are preferred. For example, for ten inch targets, the inwardly facing surface of the dark-space shield may have an inside diameter of 10.124+/−0.005 inches for standard pressure processes and 10.100+/−0.005 inches for high pressure processes. For twelve inch targets (11.625 inch actual diameter), the inside diameter may be 11.749+/−0.005 inches for standard pressure processes and 11.725+/−0.005 inches for high pressure processes.

In addition to the need for one configuration of adapter body 32 for each target 11,11a of a particular diameter, the number of adapter bodies 32 that may be necessary is multiplied by the number of target diameters. For example, to accommodate a type RM cathode and a type SPA cathode in both nominal ten inch and nominal twelve inch diameters, four configurations of adapter bodies 32 are required. Further, different target-to-wafer spacings might be required for the processes with some or all of the targets. As illustrated in FIGS. 4, 4A, 5 and 5A, accommodations of such spacings can be provided with different height adaptor bodies.

Figure 4:
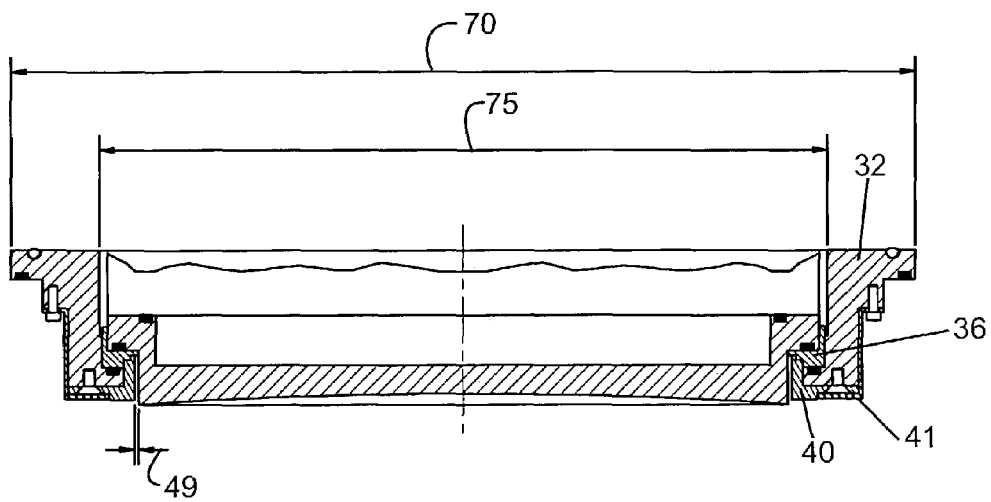
FIGS. 4 and 4A are cross-sectional drawings, similar to FIGS. 2 and 2A, respectively, more particularly describing the alternative combinations of adapter assembly components for use with cathode assemblies having nominal ten inch targets.
Figure 4A:
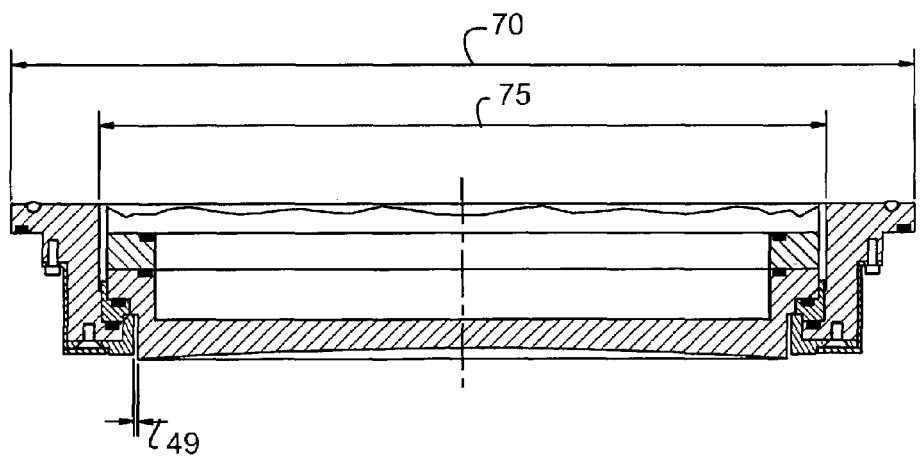

For example, this is depicted in FIG. 4, which illustrates the assemblies for ten inch type RM targets and FIG. 4A, which illustrates the assemblies for ten inch SPA targets. Four tables, Tables 4-1 through 4—4 are keyed to FIGS. 4 and 4A and identify various alternative parts, as follows:

TABLE 4-1

| ITEM NO. | ADAPTER ASSY P/N | APPLICATION | TARGET SPACING |
| --- | --- | --- | --- |
| 32-1 | A129959-17 | RM 10/SPA 10 | 1.7" |
| 32-2 | A129959-20 | RM 10/SPA 10 | 2.0" |
| 32-3 | A129959-25 | RM 10/SPA 10 | 2.5" |

TABLE 4-2

| ITEM NO. | INSULATOR P/N | APPLICATION |
| --- | --- | --- |
| 36-4 | D129963 | RM 10 |
| 36-5 | D129964 | SPA 10 |

TABLE 4-3

| ITEM NO. | DARK SPACE SHIELD P/N | APPLICATION |
| --- | --- | --- |
| 40-6 | D129962-050S | RM 10 |
| 40-7 | D129962-062S | RM 10 |
| 40-8 | D129962-050SP | RM 10 |
| 40-9 | D129962-062SP | RM 10 |

TABLE 4-3-continued

| ITEM NO. | DARK SPACE SHIELD P/N | APPLICATION |
|---|---|---|
| 40-10 | D129962-062A | RM 10 |
| 40-11 | D129965-62S | SPA 10 |

TABLE 4-4

| ITEM NO. | ADAPTER SHIELD | APPLICATION | TARGET SPACING |
|---|---|---|---|
| 41-12 | D130010-17A | RM 10/SPA 10 | 1.7 |
| 41-13 | D130010-17S | RM 10/SPA 10 | 1.7 |
| 41-14 | D130010-20A | RM 10/SPA 10 | 2.0 |
| 41-15 | D130010-20S | RM 10/SPA 10 | 2.0 |
| 41-16 | D130010-25A | RM 10/SPA 10 | 2.5 |
| 41-17 | D130010-25S | RM 10/SPA 10 | 2.5 |

Table 4-1 lists three adapter bodies, 32-1, 32-2 and 32-3, for accommodating target-to-wafer spacings of 1.7", 2.0" and 2.5". Each of these is suitable for either type RM or type SPA targets. Two different insulator configurations, 36-4 and 36-5, are identified in Table 4-2, which adapt the two types of targets to each of the different size bodies 32. Table 4—4 identifies three adapter shields 41 to clad each adaptor body 32, which are provided in two materials each for compatibility with different processes. These adapter shields may be identified as 41-12 through 41-17. Table 4-3 identifies alternative dark space shields 40-6 through 40-11. These fit on any of the three adapter bodies 32 to accommodate different target materials and types. As shown in the illustrated embodiment, adapter body 32 has an outside diameter 70 of at least approximately 14.49 inches and an inside diameter 75 of at least approximately 11.12 inches.

Figure 5:
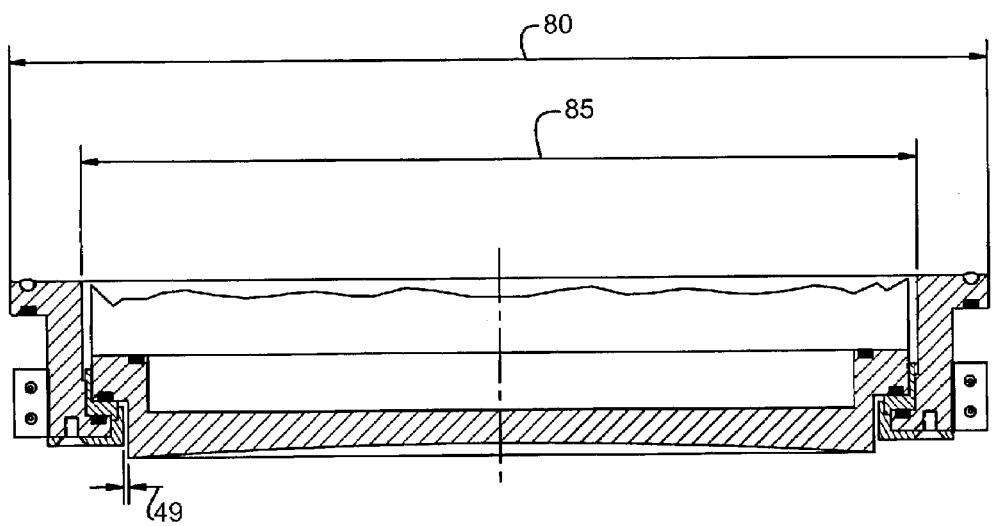
FIGS. 5 and 5A are cross-sectional drawings, similar to FIGS. 4 and 4A, respectively, more particularly describing the alternative combinations of adapter assembly components for use with cathode assemblies having nominal twelve inch targets.
Figure 5A:
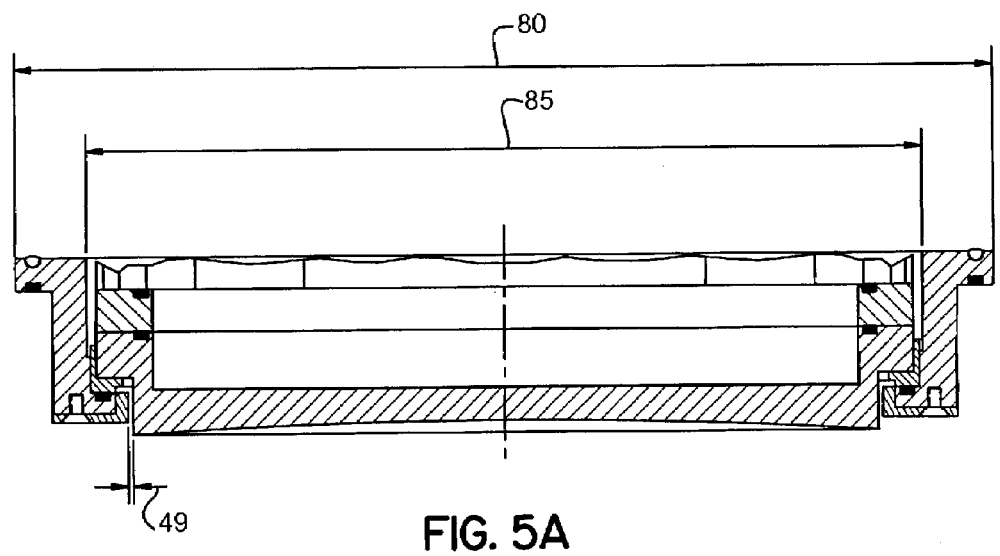

Similarly, FIG. 5 also includes two figures, FIG. 5 (left side), which illustrates the assemblies for twelve inch type RM targets, and FIG. 5A (right side), which illustrates the assemblies for twelve inch SPA targets. Three tables, Tables 5-1 through 5-3 are keyed to FIGS. 5 and 5A and identify various alternative parts, as follows:

TABLE 5-1

| ITEM NO. | ADAPTER ASSY P/N | APPLICATION | TARGET SPACING |
|---|---|---|---|
| 32a-1 | A129966-20 | RM 12/SPA 12 | 2.0" |
| 32a-2 | A129966-25 | RM 12/SPA 12 | 2.5" |

TABLE 5-2

| ITEM NO. | INSULATOR P/N | APPLICATION |
|---|---|---|
| 36a-3 | D129970 | RM 12 |
| 36a-4 | D129971 | SPA 12 |

TABLE 5-3

| ITEM NO. | DARK SPACE SHIELD P/N | APPLI-CATION | TARGET SPACING | ADAPTER SHIELD | ITEM NO. |
|---|---|---|---|---|---|
| 40a-5 | D129969-050S | RM 12 | 2.0 | D124839-S | 41a-9 |
| 40a-6 | D1S9969-062S | RM 12 | 2.0 | D124839-S | 41a-9 |
| 40a-7 | D129969-062A | RM 12 | 2.0 | D124839-A | 41a-10 |
| 40a-8 | D129972-062S | SPA 12 | 2.0 | D124839-S | 41a-13 |
| 40a-5 | D129969-050S | RM 12 | 2.5 | D124841-S | 41a-11 |
| 40a-6 | D129969-062S | RM 12 | 2.5 | D124841-S | 41a-11 |
| 40a-7 | D129969-062A | RM 12 | 2.5 | D124841-A | 41a-12 |
| 40a-8 | D129972-062S | SPA 12 | 2.5 | D124841-S | 41a-14 |

Table 5-1 lists two adapter bodies, 32a-1 and 32a-2, for accommodating target-to-wafer spacings of 2.0" and 2.5", each of which is suitable for either type RM or type SPA targets. Two different insulator configurations, 36a-3 and 36a-4, are identified in Table 5-2, which adapt the two types of targets to each of the different size bodies 32a. Table 5-3 identifies different adapter shields 41a-9 through 41a-14 to clad each of the two adaptor bodies 32, which are provided in different materials for compatibility with different processes. Table 5-3 also identifies alternative dark space shields 40a-5 through 40a-8, which fit on either of the two twelve inch adapter bodies 32a to accommodate different target materials and types. As shown in the illustrated embodiment, adapter body 32a has an outside diameter 80 of at least approximately 14.49 inches and an inside diameter 85 of at least approximately 12.77 inches.

Figure 6C:
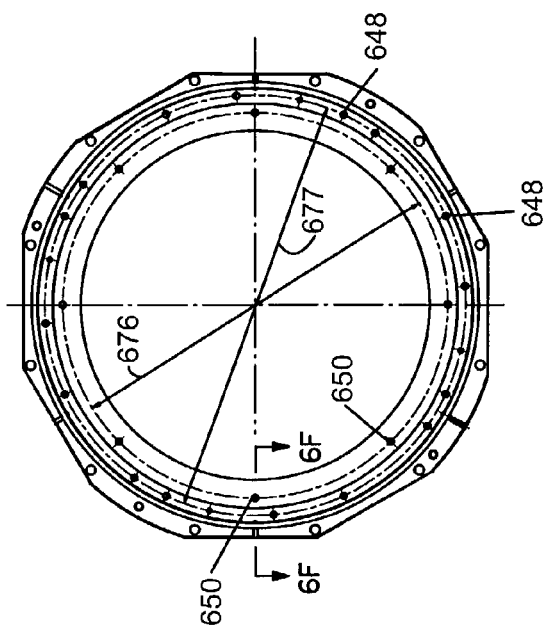
Figure 6B:
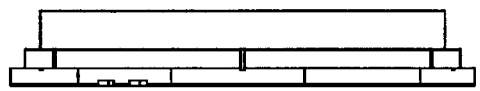
Figure 6A:
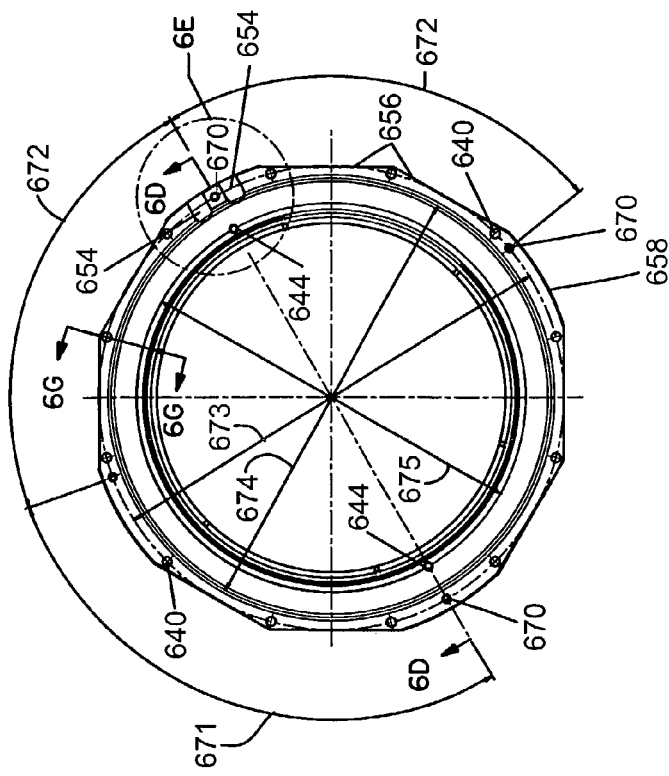
Figure 6G:
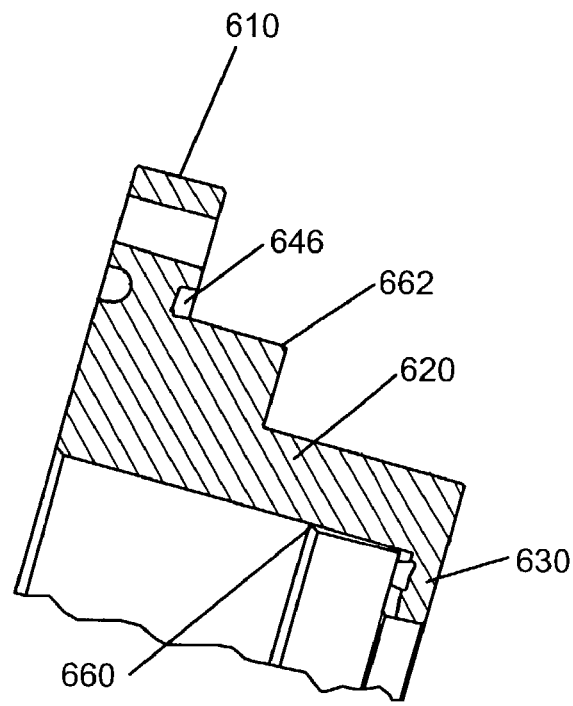
Figure 6H:
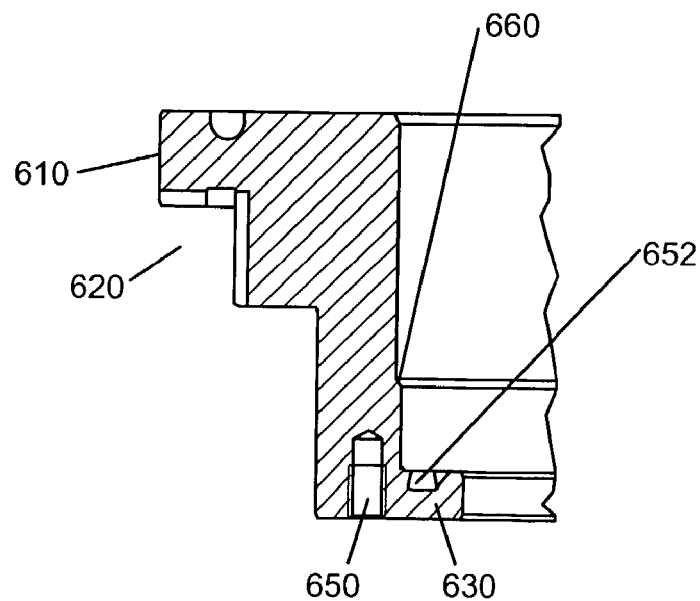

FIGS. 6A–6E, 6G and 6H show schematic views of an adapter body in accordance with an embodiment of the invention. FIG. 6A shows a top view; FIG. 6B shows a side view; and FIG. 6C shows a bottom view. FIG. 6D shows a more detailed side view of an adapter body. The terms "top", "bottom" and "side" are chosen for convenience only, with "top" referring to the cathode side and "bottom" referring to the wafer or chamber side of the adapter assembly. In the machines for which these adapters are suited, the target faces sideways toward a wafer supported in a vertical plane.

Adapter body 32 comprises outer flange 610, ring portion 620, and inner shoulder 630. Outer flange 610 comprises inner surface 610a, top surface 610b, an outer surface 610c, and a bottom surface 610d. Ring portion 620 comprises an inner surface 620a coupled to the top surface 630b of the inner shoulder 630 and an outer surface 620c coupled to the bottom surface 610d of the outer flange. Inner shoulder 630 comprises inner surface 630a, top surface 630b coupled to the inner surface 620a of ring portion 620, an outer surface 630c coupled to the outer surface 620c of ring portion 620, and a bottom surface 630d coupled to the inner surface 630a and the outer surface 630c.

Outer flange 610 can comprise a number of through-holes 640 extending from the top surface 610b to the bottom surface 610d. For example, hole 640 can have a diameter of at least 0.25 inches. Holes 640 can have angular displacements of approximately 30 degrees. Holes 640 can be located on a circle 673 having a diameter of approximately 13.87 inches.

Outer flange 610 can comprise a number of through-holes 670 extending from the top surface 610b to the bottom surface 610d. For example, hole 670 can have a diameter of at least 0.25 inches and helicoils can be installed in holes 670. Holes 670 can have angular displacements 671 and 672 of approximately 100 degrees and approximately 80 degrees. Holes 670 can be located on a circle 673 having a diameter of approximately 13.87 inches.

Outer flange 610 can comprise a number of non-through-holes 644 in the top surface 610b. For example, hole 644 can have a diameter of at least 0.25 inches, and helicoils can be installed in holes 644. Holes 644 can be located on a circle 675 having a diameter of approximately 11.62 inches.

Outer flange 610 can comprise an annular groove 642, and a cooling element (not shown) can be installed in the groove. For example, annular groove 642 can be located on the top surface 610b of the outer flange and can have a diameter 674 of approximately 13.12 inches. Outer flange 610 can comprise another annular groove 646, and an o-ring (not shown) can be installed in the groove. For example, annular groove 646 can be located on the bottom surface 610d of the outer flange, can have an inside diameter 688 of approximately 12.99 inches, and can have a width of approximately 0.15 inches. Outer flange 610 can comprise a number of non-through-holes 648 in the bottom surface 610d, and helicoils can be installed in holes 644.

Inner shoulder 630 can comprise a number of non-through-holes 648 and 650 in the bottom surface 630d. For example, holes 648 and 650 can have diameters of at least 0.14 inches, and helicoils can be installed in holes 648 and 650 lying on circles 677 and 676 respectively.

Inner shoulder 630 can comprise annular groove 652, and an o-ring (not shown) can be installed in the groove. For example, annular groove 652 can be located on the top surface 630b of the inner shoulder 630, can have an inside diameter 680 of approximately 10.77+/−0.015 inches, and can have a width of approximately 0.125 inches.

In addition, outer flange 610 comprises a number of slots 654. For example, slot 654 can have a width of 0.5 inches, and a cooling element (not shown) can be installed using the slots. Outer surface 610c of outer flange 610 can comprise a number of flat surfaces 656 and a number of curved surfaces 658.

Outer flange 610 can have an inside diameter 679 of at least approximately 11.185 inches and an outside diameter 678 of at least approximately 14.50 inches. Outer flange 610 can further comprise a step 662 having an inside diameter 687 of approximately 12.08 inches and an outside diameter 688 of at most approximately 13.00 inches. Inner shoulder 630 can have an inside diameter 685 of at least approximately 10.415 inches and an outside diameter 687 of at least approximately 12.08 inches. Inner surface 620a can comprise a lip portion 660.

Outer flange 610 can have a thickness 681 of approximately 0.51 inches. Step 662 can have a height 682 of approximately 1.08 inches. Inner shoulder 630 can have a thickness 684 of at least approximately 0.25 inches. Body portion 620 can have an inside diameter 686 of at least approximately 11.12 inches.

Adapter body 32 can comprise different heights 683 that can be application dependent. For example, in a first application, the height can be approximately 1.44 inches; in a second application, the height can be approximately 1.94 inches; and in a third application, the height can be approximately 2.24 inches. These heights 683 may correspond to target-to-substrate spacings of 2.5 inches, 2.0 inches and 1.7 inches, respectively. The height 683, less the flange and shoulder thicknesses 681 and 684, produce a net offset from the outer or top surface of the chamber wall 16 to the face or top surface of the target insulator 36 of 0.68, 1.18 and 1.48 inches, respectively.

In one embodiment, adapter body 32 comprises a single block of material. For example, the adapter body can be fabricated from a block of aluminum, and the adapter body can be finished to provide a roughened surface which aids the formation of a uniform coating during processing. Alternately, adapter body 32 can comprise more than one piece.

Figure 7A:
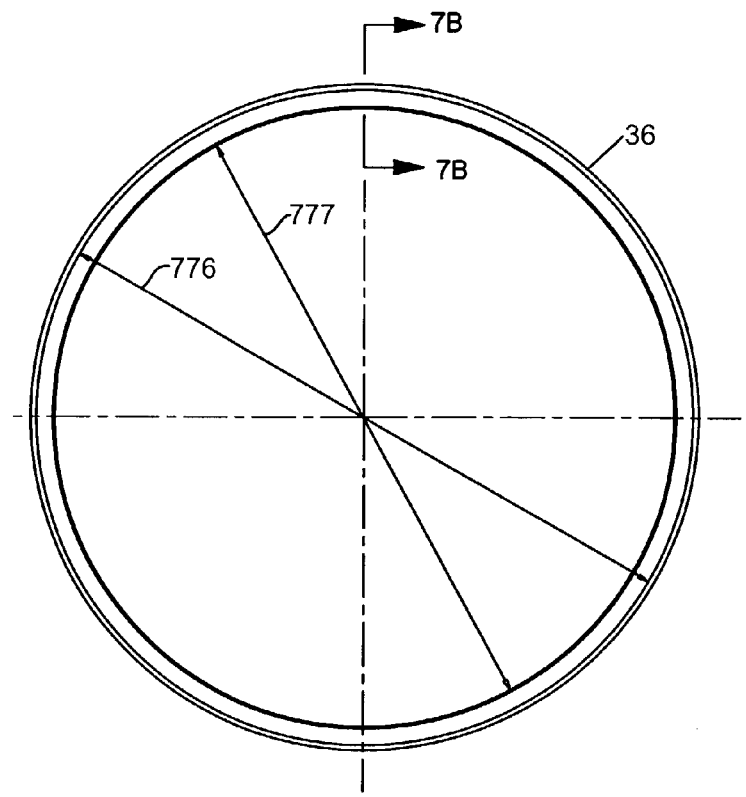
FIGS. 7A and 7B shows schematic views of an insulator in accordance with an embodiment of the invention.
Figure 7B:
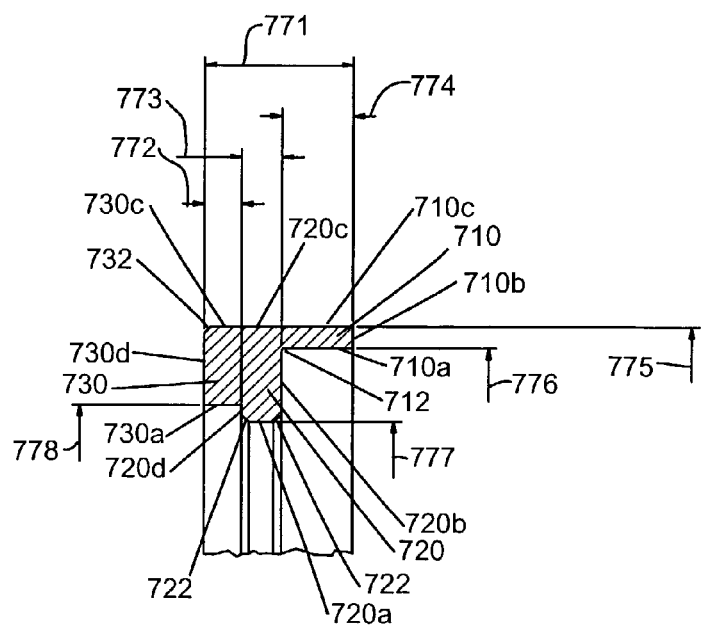

FIGS. 7A and 7B show schematic views of an insulator in accordance with an embodiment of the invention. Insulator 36 comprises top ring 710, body portion 720, and bottom ring 730. Top ring 710 comprises inner surface 710a, top surface 710b, and an outer surface 710c. Body portion 720 comprises an inner surface 720a, a top surface 720b coupled to the inner surface 710a of top ring 710, an outer surface 720c coupled to the outer surface 710c of top ring 710, and a bottom surface 720d coupled to the inner surface 720a. Bottom ring 730 comprises inner surface 730a coupled to the bottom surface 720d of the body portion, an outer surface 730c coupled to the outer surface 720c of ring portion 720, and a bottom surface 730d.

Body portion 720 can comprise flattened edges 722, and bottom ring 730 can comprise flattened edges 732. Top surface 720b of body portion 720 can be coupled to the inner surface 710a of top ring 710 using a rounded edge 712.

Top ring 710 can have an inside diameter 776 of at least approximately 10.932 inches and an outside diameter 775 of at most approximately 11.12 inches. Body portion 720 can have an inside diameter 777 of at least approximately 10.32 inches and an outside diameter 775 of at most approximately 11.12 inches. Bottom ring 730 can have an inside diameter 778 of at least approximately 10.46 inches and an outside diameter 775 of at most approximately 11.12 inches.

Top ring 710 can have a height 774 of approximately 0.29 inches; body portion 720 can have a height 773 of approximately 0.16 inches; and an bottom ring 730 can have a height 772 of approximately 0.15 inches. Insulator 36 can have a height 771 of approximately 0.6 inches. Heights 772 and 773 should be consistent with the thickness of the body 32 in accordance with the target-to-substrate spacing of the application.

In one embodiment, insulator 36 comprises a single block of material. For example, insulator 36 can be fabricated as a block of TEFLON, and PTFE grade 7 or PTFE grade 8 can be used. Alternately, insulator 36 can comprise a different insulating material.

Figure 8A:
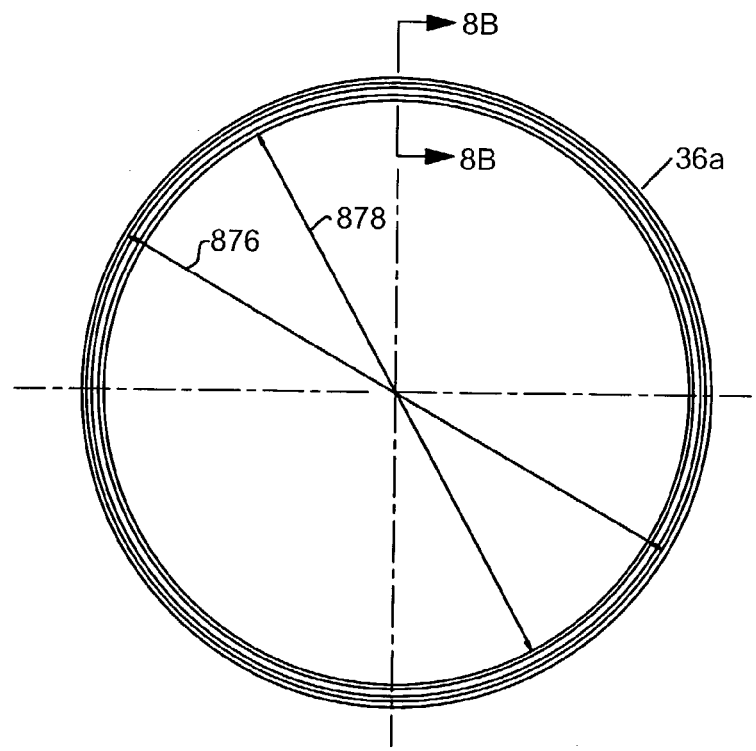
FIGS. 8A and 8B shows schematic views of another insulator in accordance with an embodiment of the invention.
Figure 8B:
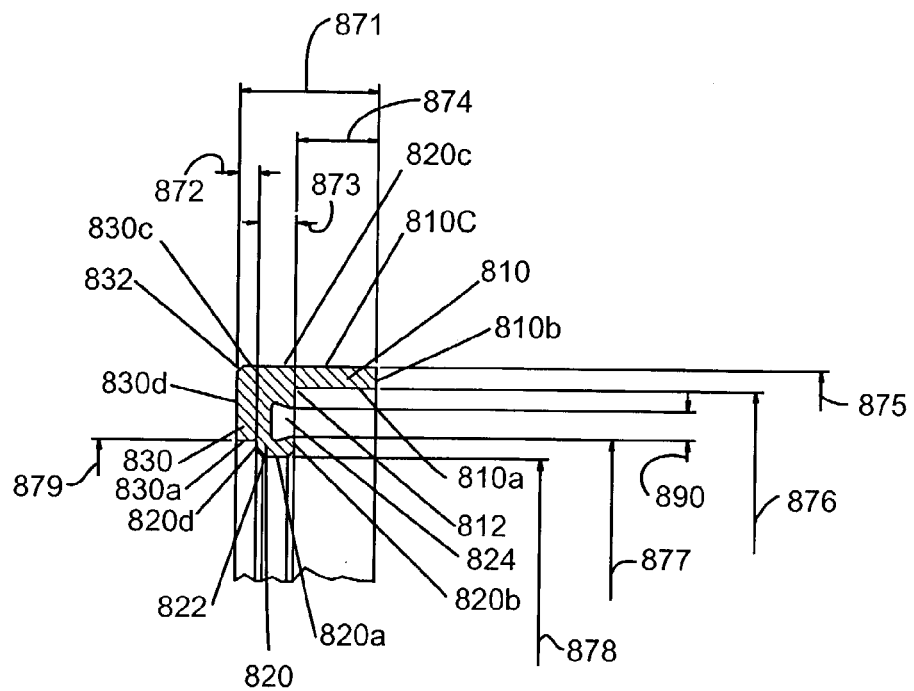

FIGS. 8A and 8B show schematic views of another insulator in accordance with an embodiment of the invention. Insulator 36a comprises top ring 810, body portion 820, and bottom ring 830. Top ring 810 comprises inner surface 810a, top surface 810b, and an outer surface 810c. Body portion 820 comprises an inner surface 820a, a top surface 820b coupled to the inner surface 810a of top ring 810, an outer surface 820c coupled to the outer surface 810c of top ring 810, and a bottom surface 820d coupled to the inner surface 820a. Bottom ring 830 comprises inner surface 830a coupled to the bottom surface 820d of the body portion 820, an outer surface 830c coupled to the outer surface 820c of body portion 820, and a bottom surface 830d.

Body portion 820 can comprise flattened edges 822, and bottom ring 830 can comprise shaped edges 832. Body portion 820 can comprise an annular groove 824. For example, annular groove 824 can be located on the top surface 820b of the body portion 820, can have an inside diameter 877 of approximately 10.47 inches, can have a width 890 of approximately 0.11 inches, and an o-ring (not shown) can be installed in the groove. Top surface 820b of body portion 820 can be coupled to the inner surface 810a of top ring 810 using a rounded edge 812.

Top ring 810 can have an inside diameter 876 of at least approximately 10.932 inches and an outside diameter 875 of at most approximately 11.12 inches. Body portion 820 can have an inside diameter 878 of at least approximately 10.32 inches and an outside diameter 875 of at most approximately 11.12 inches. Bottom ring 830 can have an inside diameter 879 of at least approximately 10.46 inches and an outside diameter 875 of at most approximately 11.12 inches.

Top ring 810 can have a height 874 of approximately 0.35 inches; body portion 820 can have a height 873 of approximately 0.17 inches; and a bottom ring 830 can have a height 872 of approximately 0.088 inches. Insulator 36a can have a height 871 of at least approximately 0.6 inches. Heights 872 and 873 should be consistent with the thickness of the body 32 in accordance with the target-to-substrate spacing of the application.

In one embodiment, insulator 36a comprises a single block of material. For example, insulator 36a can be fabricated as a block of TEFLON, and PTFE grade 7 or PTFE grade 8 can be used. Alternately, insulator 36a can comprise a different insulating material.

Figure 9A:
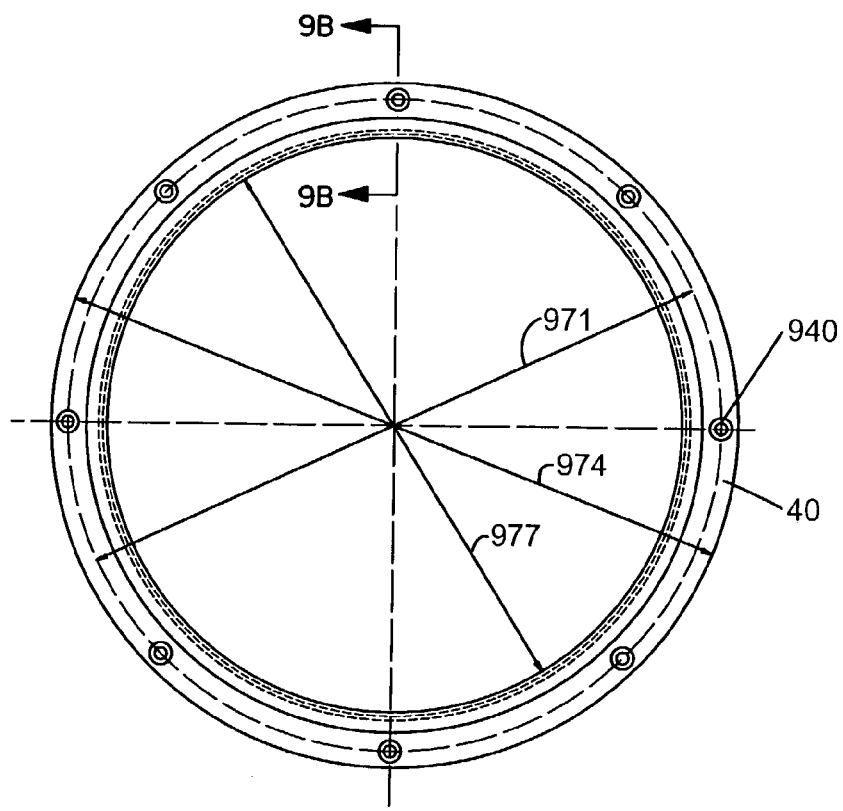
FIGS. 9A and 9B shows schematic views of a dark space shield in accordance with an embodiment of the invention.
Figure 9B:
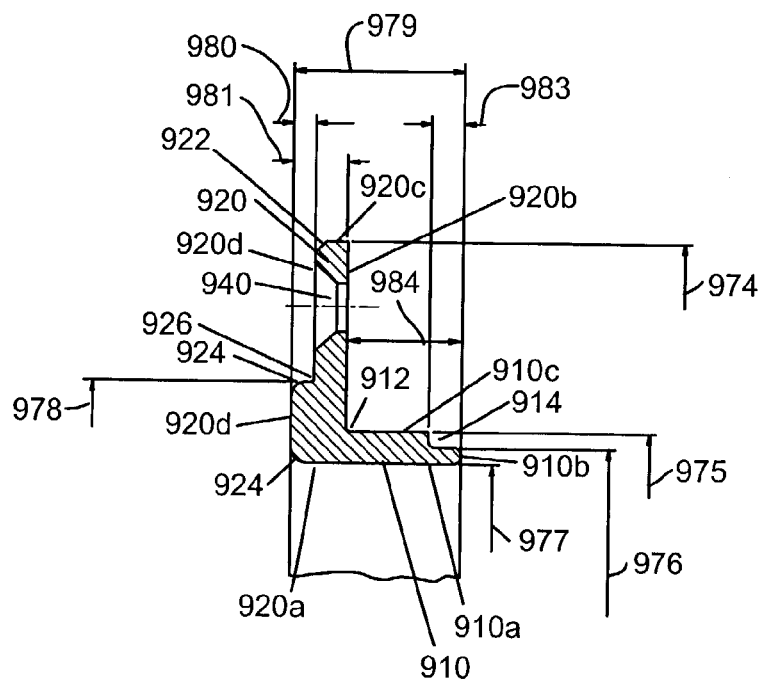

FIGS. 9A and 9B shows schematic views of a dark space shield in accordance with an embodiment of the invention. Dark space shield 40 comprises top ring 910 and body portion 920. Top ring 910 comprises inner surface 910a, top surface 910b, and an outer surface 910c. Body portion 920 comprises an inner surface 920a coupled to the inner surface 910a of top ring 910, a top surface 920b coupled to the outer surface 910c of top ring 910, an outer surface 920c coupled to the top surface 920b of body 920, and a bottom surface 920d coupled to the outer surface 920c and the inner surface 920a.

Body portion 920 can comprise shaped edge 922, rounded edges 924, and rounded corner edge 926. Top surface 920b of body portion 920 can be coupled to the outer surface 910c of top ring 910 using a rounded edge 912. Body portion 920 can comprise a number of through-holes 940 extending from the top surface 920b to the bottom surface 920d. For example, hole 940 can have a diameter of at least 0.19 inches, and can be counter sunk. Holes 940 can have angular displacements of approximately 45 degrees. Holes 940 can be located on a circle 971 having a diameter of approximately 11.50 inches.

Top ring 910 can have an inside diameter 977 of approximately 10.10 inches and an outside diameter 975 of approximately 10.405 inches. Body portion 920 can have an inside diameter 977 of approximately 10.10 inches and an outside diameter 974 of at most approximately 12.08 inches. Top ring 910 can have a height 984 of approximately 0.505 inches, and body portion 920 can have a height 981 of approximately 0.244 inches. Top ring 910 can further comprise a step 914 having an inside diameter 976 of at most approximately 10.26 inches and a depth 983 of approximately 0.14 inches. Body portion 920 can further comprise a step 926 having an inside diameter 978 of approximately 10.84 inches and a depth 980 of approximately 0.09 inches. Dark space shield 40 can have a height 979 of approximately 0.74 inches.

In one embodiment, dark space shield 40 comprises a single block of material. For example, dark space shield 40 can be fabricated from a block of stainless steel. In addition, dark space shield 40 can have its surface roughened and a coating can be applied. For example, the surface can be blasted and a coating can be applied. Alternately, dark space shield 40 can comprise a different material such as aluminum.

Figure 10A:
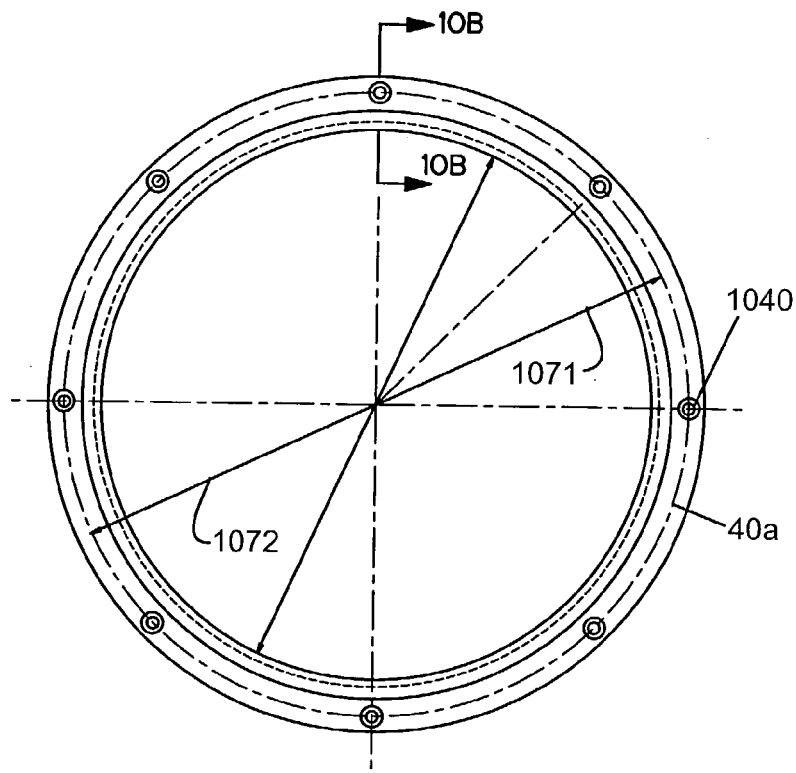
FIGS. 10A and 10B shows schematic views of another dark space shield in accordance with an embodiment of the invention.
Figure 10B:
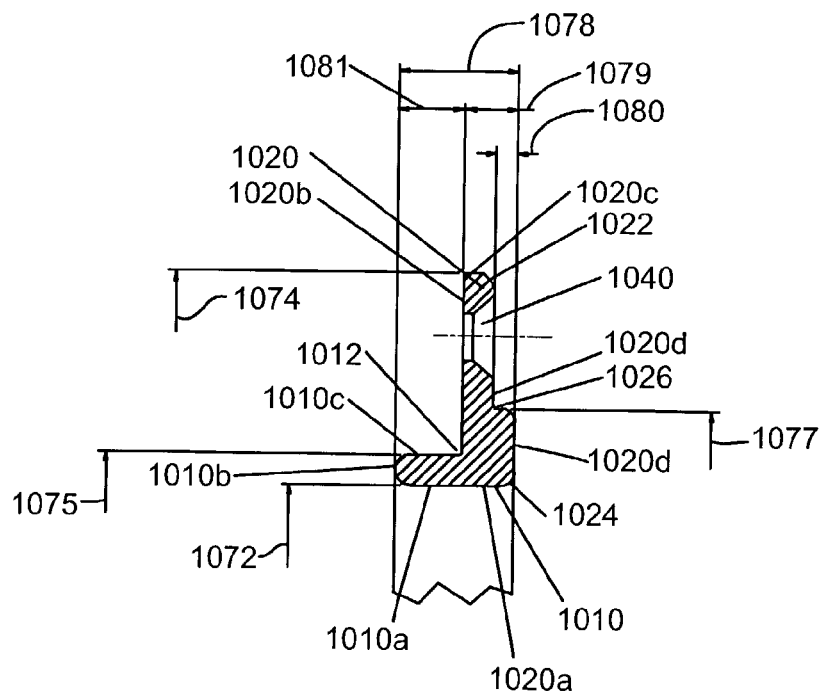

FIGS. 10A and 10B shows schematic views of another dark space shield in accordance with an embodiment of the invention. Dark space shield 40a comprises top ring 1010, and body portion 1020. Top ring 1010 comprises inner surface 1010a, top surface 1010b, and an outer surface 1010c. Body portion 1020 comprises an inner surface 1020a coupled to the inner surface 1010a of top ring 1010, a top surface 1020b coupled to the outer surface 1010c of top ring 1010, an outer surface 1020c coupled to the top surface 1020b of body 1020, and a bottom surface 1020d coupled to the outer surface 1020c and the inner surface 1020a.

Body portion 1020 can comprise shaped edge 1022, rounded edges 1024, and rounded corner edge 1026. Top surface 1020b of body portion 1020 can be coupled to the outer surface 1010c of top ring 1010 using a rounded edge 1012. Body portion 1020 can comprise a number of through-holes 1040 extending from the top surface 1020b to the bottom surface 1020d. For example, hole 1040 can have a diameter of at least 0.19 inches, and can be counter sunk. Holes 1040 can have angular displacements of approximately 45 degrees. Holes 1040 can be located on a circle 1071 having a diameter of approximately 11.50 inches.

Top ring 1010 can have an inside diameter 1072 of approximately 10.12 inches and an outside diameter 1075 of at most approximately 10.405 inches. Body portion 1020 can have an inside diameter 1072 of approximately 10.12 inches and an outside diameter 1074 of approximately 12.08 inches. Top ring 1010 can have a height 1081 of at least approximately 0.305 inches, and body portion 1020 can have a height 1079 of approximately 0.244 inches. Body portion 1020 can further comprise a step 1026 having an inside diameter 1077 of approximately 10.4 inches and a depth 1080 of approximately 0.09 inches. Dark space shield 40a can have a height 1078 of approximately 0.54 inches.

In one embodiment, dark space shield 40a comprises a single block of material. For example, dark space shield 40a can be fabricated from a block of stainless steel. In addition, dark space shield 40a can be have its surface roughened and a coating can be applied. For example, the surface can be blasted and a coating can be applied. Alternately, dark space shield 40a can comprise a different material.

Figure 11A:
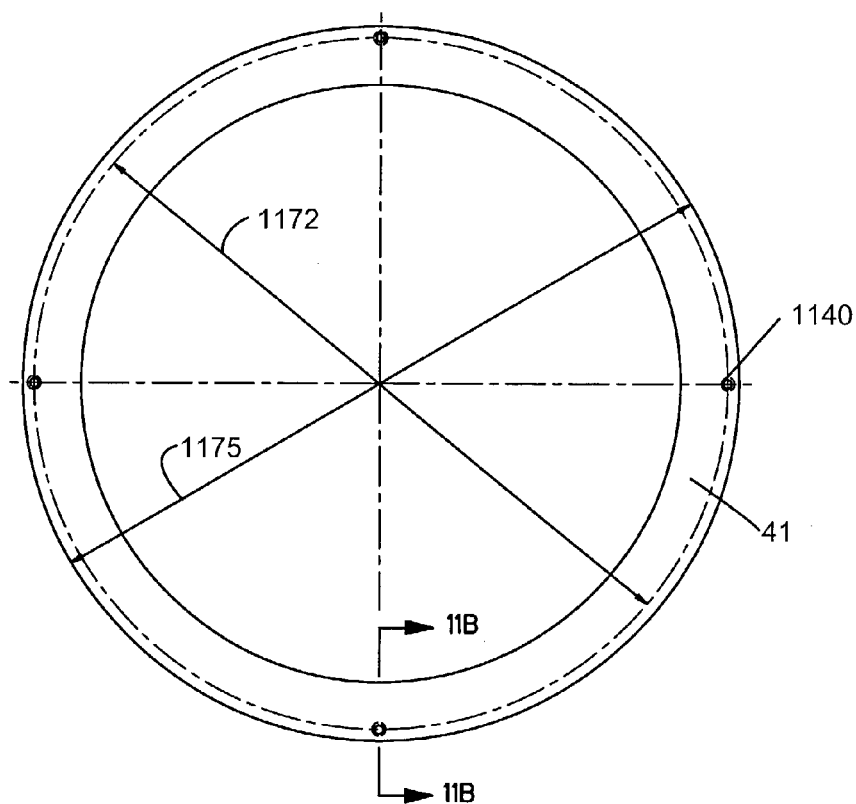
FIGS. 11A and 11B shows schematic views of an adapter shield in accordance with an embodiment of the invention.
Figure 11B:
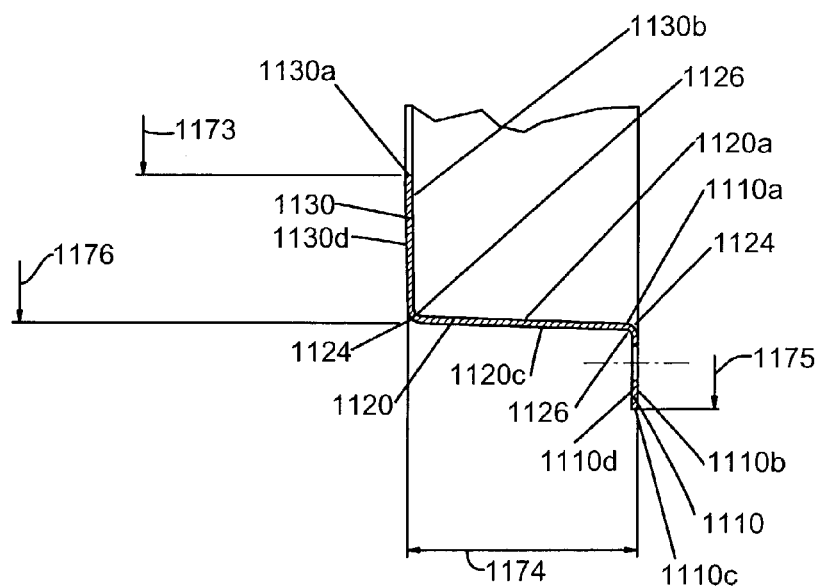

FIGS. 11A and 11B show schematic views of an adapter shield in accordance with an embodiment of the invention. Adapter shield 41 comprises top ring 1110, and body portion 1120. Top ring 1110 comprises inner surface 1110a, top surface 1110b, an outer surface 1110c, and bottom surface 1110d. Body portion 1120 comprises an inner surface 1120a coupled to the inner surface 1110a of top ring 1110, an outer surface 1120c coupled to the bottom surface 1110d of top ring 1110. Bottom ring 1130 comprises inner surface 1130a, top surface 1130b coupled to the inner surface 1120a of body portion 1120, and a bottom surface 1130d coupled to the outer surface 1120c of body portion 1120.

Body portion 1120 can comprise rounded edges 1124, and rounded corners 1126. Top ring 1110 can comprise a number of through-holes 1140 extending from the top surface 1110b to the bottom surface 1110d lying at 90 degree intervals on a circle of diameter 1172 of approximately 12.563 inches.

Top ring 1110 can have an outside diameter 1175 of approximately 12.98 inches and a inside diameter 1176 of at least approximately 12.2 inches. Bottom ring 1130 can have an outside diameter of approximately 12.14 inches and a inside diameter 1173 of at least approximately 10.85 inches.

Adapter shield 41 can comprise different heights 1174 that can be application dependent. For example, in a first application, the height can be approximately 0.53 inches; in a second application, the height can be approximately 1.03 inches; and in a third application, the height can be approximately 1.33 inches. The heights 1174 protect adapter bodies that are configured to produce target-to-substrate spacings of 2.5, 2.0 and 1.7 inches, respectively.

In one embodiment, adapter shield 41a comprises a single block of material. For example, adapter shield 41a can be fabricated from a block of stainless steel. In addition, adapter shield 41a can be have its surface roughened and a coating can be applied. For example, the surface can be blasted and a coating can be applied. Alternately, adapter shield 41*a* can comprise a different material such as aluminum.

Figure 12C:
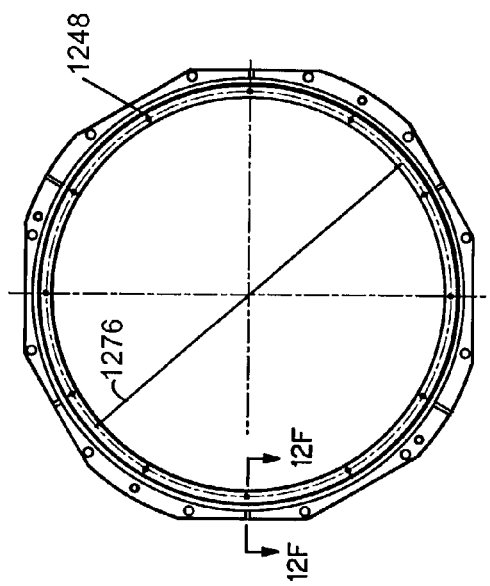
Figure 12B:
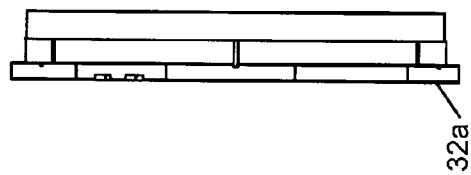
Figure 12A:
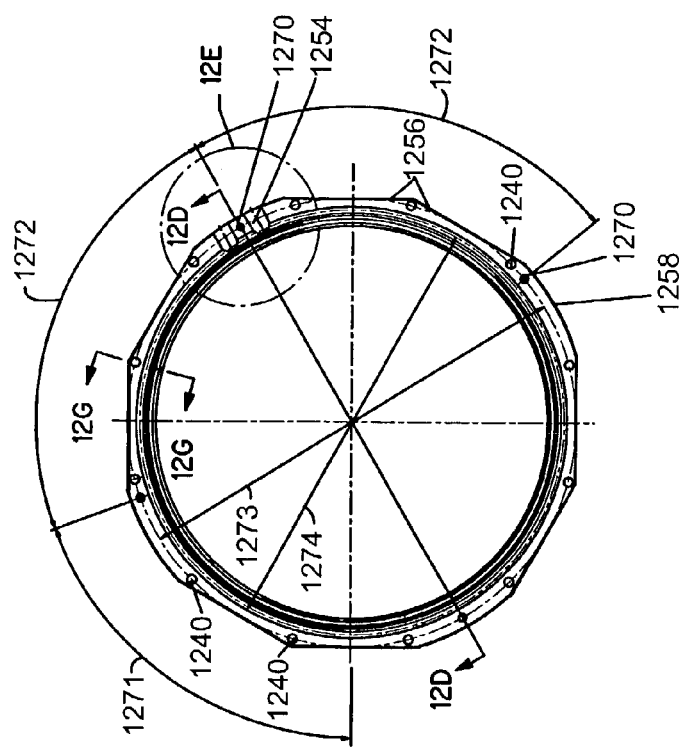
Figure 12F:
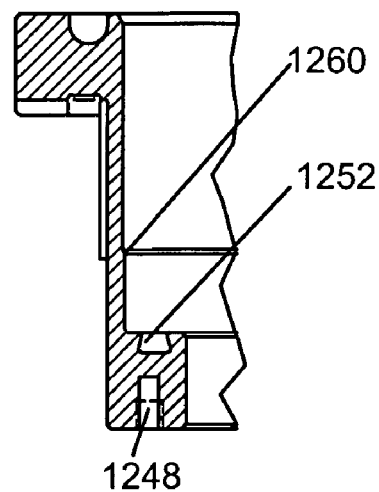
Figure 12G:
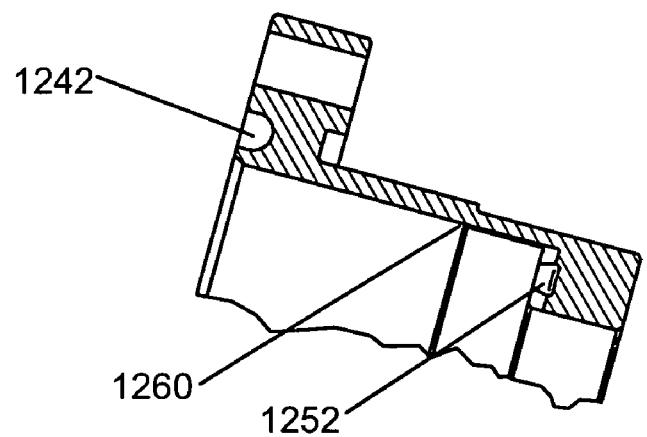

FIGS. 12A–12G show schematic views of another adapter body in accordance with an embodiment of the invention. FIG. 12A shows a top view; FIG. 12B shows a side view; and FIG. 12C shows a bottom view. FIG. 12D shows a more detailed side view of an adapter body.

Adapter body 32*a* comprises outer flange 1210, ring portion 1220, and inner shoulder 1230. Outer flange 1210 comprises inner surface 1210*a*, top surface 1210*b*, an outer surface 1210*c*, and a bottom surface 1210*d*. Ring portion 1220 comprises an inner surface 1220*a* coupled to the top surface 1230*b* of the inner shoulder 1230 and an outer surface 1220*c* coupled to the bottom surface 1210*d* of the outer flange 1210. Inner shoulder 1230 comprises inner surface 1230*a*, top surface 1230*b* coupled to the inner surface 1220*a* of ring portion 1220, an outer surface 1230*c* coupled to the outer surface 1220*c* of ring portion 1220, and a bottom surface 1230*d* coupled to the inner surface 1230*a* and the outer surface 1230*c*.

Outer flange 1210 can comprise a number of through-holes 1240 extending from the top surface 1210*b* to the bottom surface 1210*d*. For example, hole 1240 can have a diameter of at least 0.25 inches, and helicoils can be installed in holes 1240. Holes 1240 can have angular displacements of approximately 30 degrees. Holes 1240 can be located on a circle 1273 having a diameter of approximately 13.87 inches.

Outer flange 1210 can comprise a number of through holes 1270 extending from the top surface 1210*b* to the bottom surface 1210*d*. For example, hole 1270 can have a diameter of at least 0.25 inches and helicoils can be installed in holes 1270. Holes 1270 can have angular displacements 1271 and 1272 of approximately 100 degrees and approximately 80 degrees. Holes 1270 can be located on a circle 1273 having a diameter of approximately 13.87 inches.

Outer flange 1210 can comprise an annular groove 1242. For example, annular groove 1242 can be located on the top surface 1210*b* of the outer flange, can have a diameter 1274 of approximately 13.12 inches, and a cooling element (not shown) can be installed in the groove. Outer flange 1210 can comprise another annular groove 1246. For example, annular groove 1246 can be located on the bottom surface 1210*d* of the outer flange, can have an inside diameter 1284 of approximately 12.99 inches, can have a width of approximately 0.15 inches, and an o-ring (not shown) can be installed in the groove.

Inner shoulder 1230 can comprise a number of non-through-holes 1248 lying on a circle 1276 in the bottom surface 1230*d*. For example, holes 1248 can have diameters of at least 0.14 inches, and helicoils can be installed in holes 1248.

Inner shoulder 1230 can comprise annular groove 1252. For example, annular groove 1252 can be located on the top surface 1230*b* of the inner shoulder 1230 can have an inside diameter 1281 of approximately 12.30 inches, can have a width of at least approximately 0.125 inches, and an o-ring (not shown) can be installed in the groove.

In addition, outer flange 1210 comprises a number of slots 1254, For example, slot 1254 can have a width of at least 0.5 inches, and a cooling element (not shown) can be installed using the slots. Outer surface 1210*c* of outer flange 1210 can comprise a number of flat surfaces 1256 and a number of curved surfaces 1258.

Outer flange 1210 can have an inside diameter 1280 of at least approximately 12.74 inches and an outside diameter 1278 of at least approximately 14.50 inches. Body portion 1220 can further comprise a step 1262 having an inside diameter 1283 of approximately 12.92 inches and an outside diameter 1284 of at most approximately 13.00 inches. Inner shoulder 1230 can have an inside diameter 1282 of at least approximately 12.12 inches and an outside diameter 1283 of at most approximately 12.92 inches. Inner surface 1220*a* can comprise a lip portion 1260.

Outer flange 1210 can have a thickness 1285 of approximately 0.51 inches. Step 1262 can have a height 1286 of approximately 0.86 inches. Inner shoulder 1230 can have a thickness 1288 of approximately 0.49 inches. Body portion 1220 can have an inside diameter 1280 of at least approximately 12.74 inches.

Adapter body 32*a* can comprise different heights 1287 that can be application dependent. For example, in a first application, the height can be at least approximately 1.62 inches and in a second application, the height can be at least approximately 2.12 inches. These heights 1287 may correspond to target-to-substrate spacings of 2.5 inches and 2.0 inches, respectively. The height 1287, less the flange and shoulder thicknesses 1285 and 1288, produce a net offset from the outer surface of the chamber wall 16 to the face of the target insulator of 0.68 and 1.18 inches, respectively.

In one embodiment, adapter body 32*a* comprises a single block of material. For example, adapter body can be fabricated from a block of aluminum, and adapter body can be finished to provide a roughened surface which aids the formation of a uniform coating during processing. Alternately, adapter body 32*a* can comprise more than one piece.

Figure 13A:
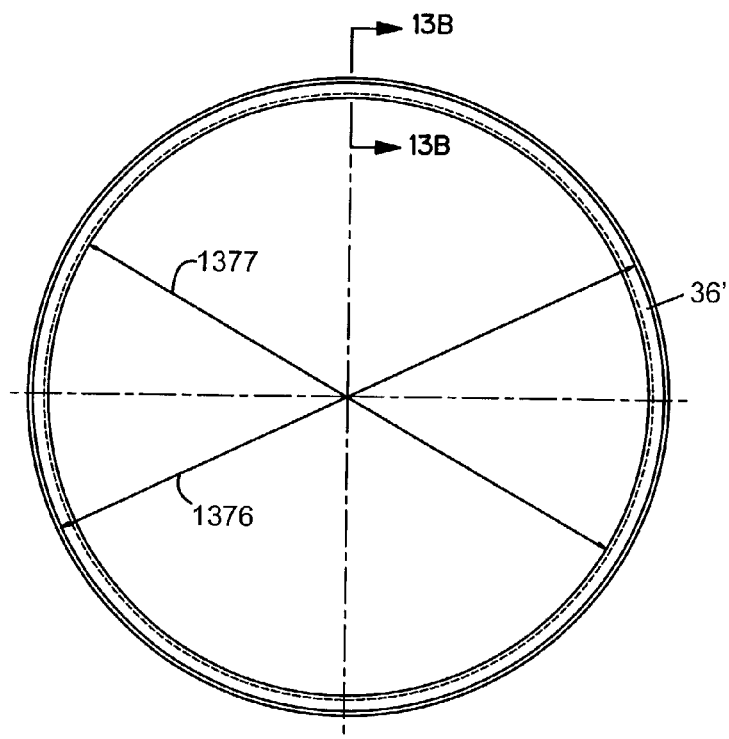
FIGS. 13A and 13B shows schematic views of another insulator in accordance with an embodiment of the invention.
Figure 13B:
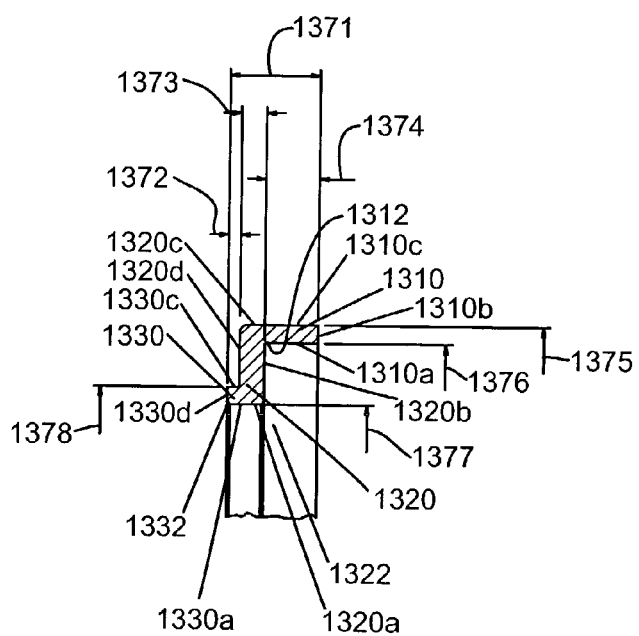

FIGS. 13A and 13B shows schematic views of another insulator in accordance with an embodiment of the invention. Insulator 36' comprises top ring 1310, body portion 1320, and bottom ring 1330. Top ring 1310 comprises inner surface 1310*a*, top surface 1310*b*, and an outer surface 1310*c*. Body portion 1320 comprises an inner surface 1320*a*, a top surface 1320*b* coupled to the inner surface 1310*a* of top ring 1310, an outer surface 1320*c* coupled to the outer surface 1310*c* of top ring 1310, and a bottom surface 1320*d* coupled to the outer surface 1320*c*. Bottom ring 1330 comprises inner surface 1330*a* coupled to the inner surface 1320*a* of the body portion, an outer surface 1330*c* coupled to the bottom surface 1320*d* of body portion 1320, and a bottom surface 1330*d*.

Body portion 1320 can comprise shaped edge 1322, and bottom ring 1330 can comprise shaped edges 1332. Top surface 1320*b* of body portion 1320 can be coupled to the inner surface 1310*a* of top ring 1310 using a rounded edge 1312.

Top ring 1310 can have an inside diameter 1376 of at least approximately 12.55 inches and an outside diameter 1375 of at most approximately 12.74 inches. Body portion 1320 can have an inside diameter 1377 of at least approximately 11.94 inches and an outside diameter of at most approximately 12.74 inches. Bottom ring 1330 can have an inside diameter 1377 of at least approximately 11.94 inches and an outside diameter 1378 of at most approximately 12.12 inches.

Top ring 1310 can have a height 1374 of approximately 0.25 inches; body portion 1320 can have a height 1373 of approximately 0.125 inches; and an bottom ring 1330 can have a height 1372 of approximately 0.063 inches.

In one embodiment, insulator 36' comprises a single block of material. For example, insulator 36' can have a height 1371 of approximately 0.43 inches, can be fabricated as a block of TEFLON, and PTFE grade 7 or PTFE grade 8 can be used. Alternately, insulator 36' can comprise a different insulating material.

Figure 14A:
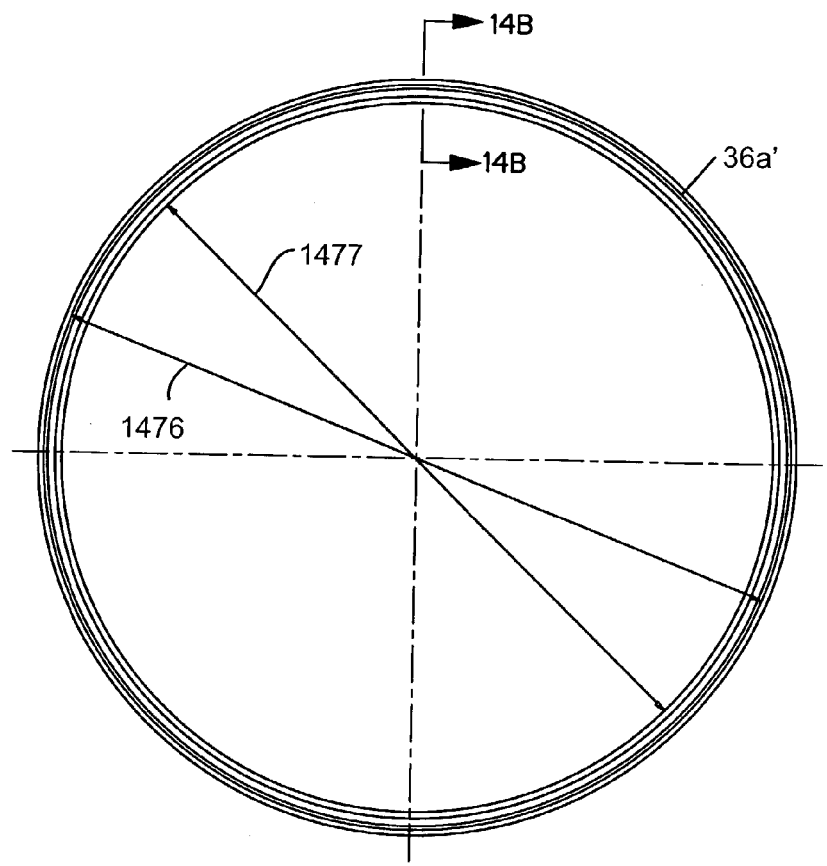
FIGS. 14A and 14B shows schematic views of another insulator in accordance with an embodiment of the invention.
Figure 14B:
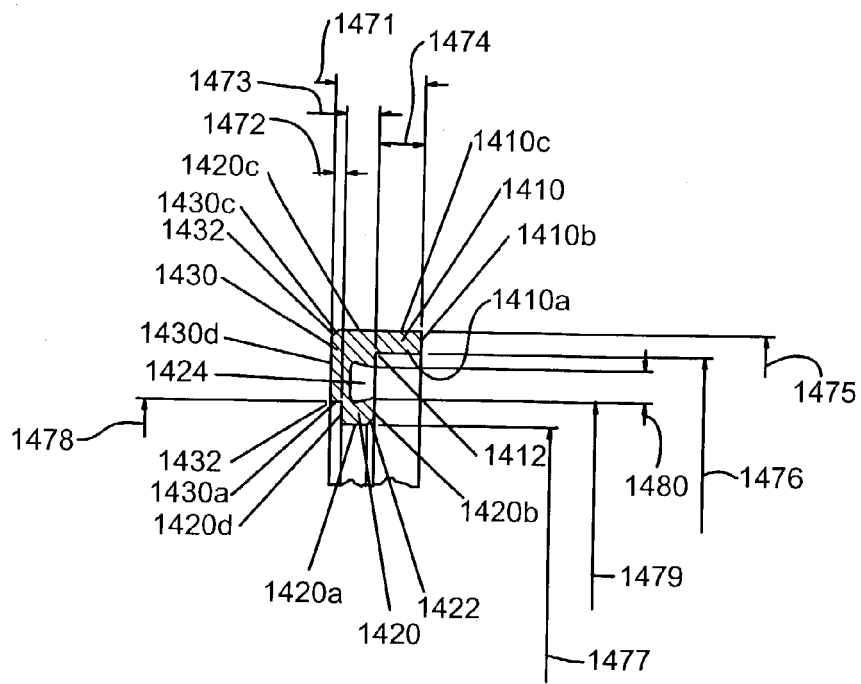

FIGS. 14A and 14B shows schematic views of an insulator in accordance with an embodiment of the invention. Insulator 36' comprises top ring 1410, body portion 1420, and bottom ring 1430. Top ring 1410 comprises inner surface 1410a, top surface 1410b, and an outer surface 1410c. Body portion 1420 comprises an inner surface 1420a, a top surface 1420b coupled to the inner surface 1410a of top ring 1410, an outer surface 1420c coupled to the outer surface 1410c of top ring 1410, and a bottom surface 1420d coupled to the inner surface 1420a. Bottom ring 1430 comprises inner surface 1430a coupled to the bottom surface 1420d of the body portion, an outer surface 1430c coupled to the outer surface 1420c of body portion 1420, and a bottom surface 1430d.

Body portion 1420 can comprise shaped edges 1422, and bottom ring 1430 can comprise shaped edges 1432. Body portion 1420 can comprise an annular groove 1424. For example, annular groove 1424 can be located on the top surface 1420b of the body portion 1420, can have an inside diameter 1479 of at least approximately 12.16 inches, can have a width 1480 of at least approximately 0.11 inches, and an o-ring (not shown) can be installed in the groove. Top surface 1420b of body portion 1420 can be coupled to the inner surface 1410a of top ring 1410 using a rounded edge 1412.

Top ring 1410 can have an inside diameter 1476 of at least approximately 12.55 inches and an outside diameter 1475 of at most approximately 12.74 inches. Body portion 1420 can have an inside diameter 1477 of at least approximately 11.94 inches and an outside diameter 1475 of at most approximately 12.74 inches. Bottom ring 1430 can have an inside diameter 1478 of at least approximately 12.13 inches and an outside diameter 1475 of at most approximately 12.74 inches.

Top ring 1410 can have a height 1474 of approximately 0.185 inches; body portion 1420 can have a height 1473 of approximately 0.14 inches; and a bottom ring 1430 can have a height 1472 of approximately 0.047 inches.

In one embodiment, insulator 36a' comprises a single block of material. For example, insulator 36a' can have a height 1471 of approximately 0.37 inches and can be fabricated as a block of TEFLON, PTFE grade 7 or PTFE grade 8. Alternately, insulator 36a' can comprise a different insulating material.

Figure 15A:
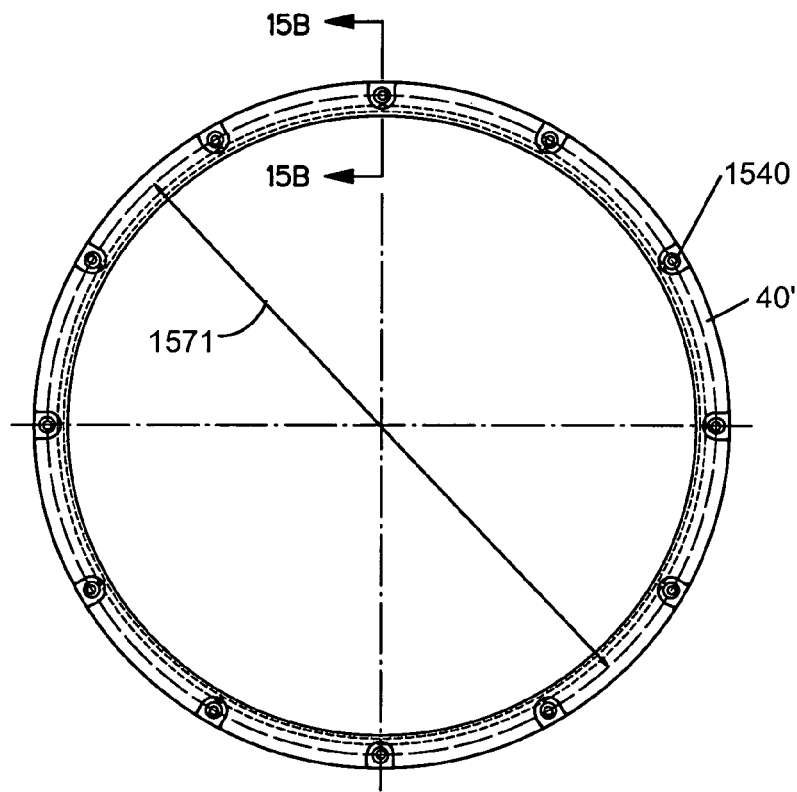
FIGS. 15A and 15B shows schematic views of another dark space shield in accordance with an embodiment of the invention.
Figure 15B:
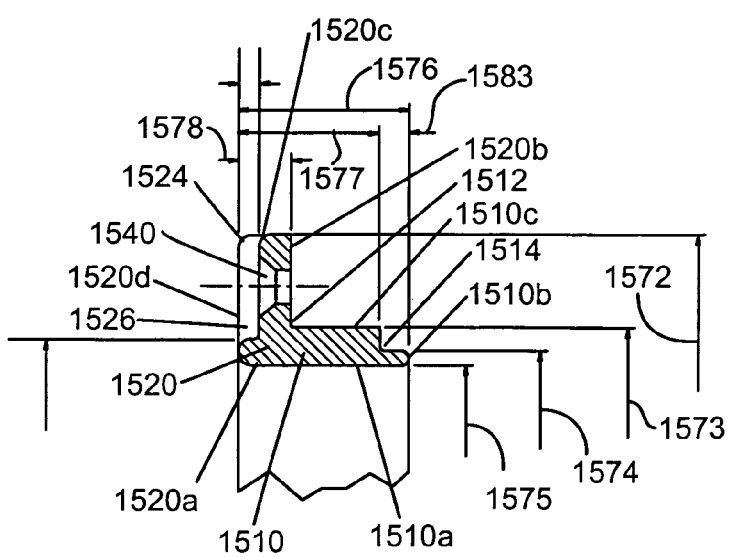

FIGS. 15A and 15B shows schematic views of a dark space shield 40' in accordance with an embodiment of the invention. Dark space shield 40' comprises top ring 1510, and body portion 1520. Top ring 1510 comprises inner surface 1510a, top surface 1510b, and an outer surface 1510c. Body portion 1520 comprises an inner surface 1520a coupled to the inner surface 1510a of top ring 1510, a top surface 1520b coupled to the outer surface 1510c of top ring 1510, an outer surface 1520c coupled to the top surface 1520b of body 1520, and a bottom surface 1520d coupled to the outer surface 1520c and the inner surface 1520a.

Body portion 1520 can comprise rounded edges 1524, and rounded corner edge 1526. Top surface 1520b of body portion 1520 can be coupled to the outer surface 1510c of top ring 1510 using a rounded edge 1512. Body portion 1520 can comprise a number of through-holes 1540 extending from the top surface 1520b to the bottom surface 1520d. For example, hole 1540 can have a diameter of at least 0.14 inches, and can be counter sunk. Holes 1540 can have angular displacements of approximately 45 degrees. Holes 1540 can be located on a circle 1571 having a diameter of approximately 12.50 inches.

Top ring 1510 can have an inside diameter 1575 of approximately 11.72 inches and an outside diameter 1573 of approximately 12.11 inches. Body portion 1520 can have an inside diameter 1575 of approximately 11.72 inches and an outside diameter 1572 of at most approximately 13.00 inches. Top ring 1510 can have a height 1577 of approximately 0.55 inches, and body portion 1520 can have a height 1578 of approximately 0.245 inches.

Top ring 1510 can further comprise a step 1514 having an inside diameter 1574 of approximately 11.89 inches and a depth 1583 of approximately 0.12 inches. Dark space shield 40' can have a height 1576 of approximately 0.74 inches.

In one embodiment, dark space shield 40' comprises a single block of material. For example, dark space shield 40' can be fabricated from a block of stainless steel. In addition, dark space shield 40' can be have its surface roughened and a coating can be applied. For example, the surface can be blasted and a coating can be applied. Alternately, dark space shield 40' can comprise a different material such as aluminum.

Figure 16A:
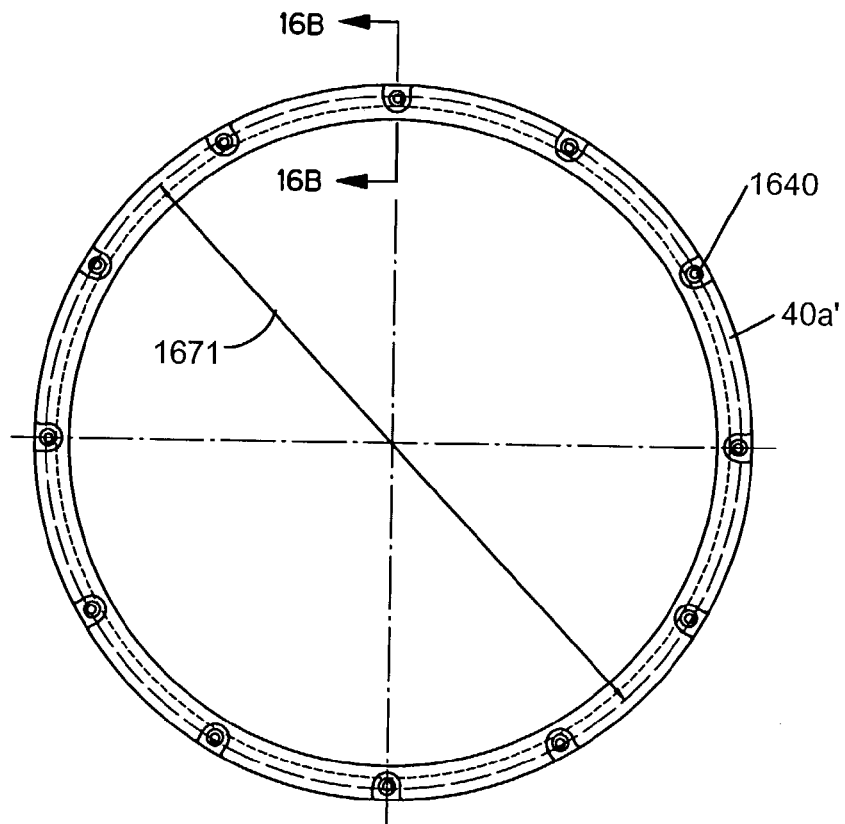
FIGS. 16A and 16B shows schematic views of another dark space shield in accordance with an embodiment of the invention.
Figure 16B:
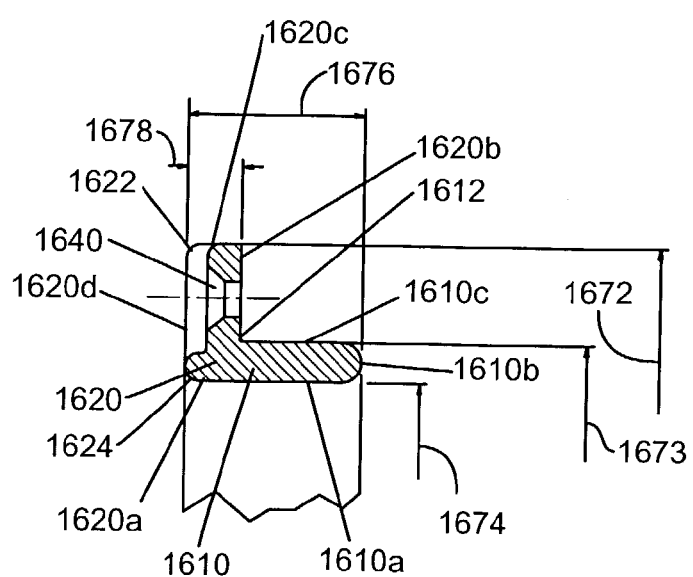

FIGS. 16A and 16B shows schematic views of another dark space shield in accordance with an embodiment of the invention. Dark space shield 40' comprises top ring 1610, and body portion 1620. Top ring 1610 comprises inner surface 1610a, top surface 1610b, and an outer surface 1610c. Body portion 1620 comprises an inner surface 1620a coupled to the inner surface 1610a of top ring 1610, a top surface 1620b coupled to the outer surface 1610c of top ring 1610, an outer surface 1620c coupled to the top surface 1620b of body 1620, and a bottom surface 1620d coupled to the outer surface 1620c and the inner surface 1620a.

Body portion 1620 can comprise rounded edges 1622 and 1624. Top surface 1620b of body portion 1620 can be coupled to the outer surface 1610c of top ring 1610 using a rounded edge 1612. Body portion 1620 can comprise a number of through-holes 1640 extending from the top surface 1620b to the bottom surface 1620d and lying on a circle 1671. For example, holes 1640 can be counter sunk.

Top ring 1610 can have an inside diameter 1674 of approximately 11.74 inches and an outside diameter 1673 of approximately 12.11 inches. Body portion 1620 can have an inside diameter of approximately 11.74 inches and an outside diameter 1672 of at most approximately 12.99 inches. Top ring 1610 can have a height 1676 of approximately 0.475 inches, and body portion 1620 can have a height of at least approximately 0.245 inches.

In one embodiment, dark space shield 40a' comprises a single block of material. For example, dark space shield 40a' can be fabricated from a block of stainless steel. In addition, dark space shield 40a' can be have its surface roughened and a coating can be applied. For example, the surface can be blasted and a coating can be applied. Alternately, dark space shield 40a' can comprise a different material.

From the above, a number of combinations of parts are seen to be possible. However, only those combinations actually required by users need be provided. Note that there are five bodies 32, three for ten inch targets (one for each of three target-to-substrate spacings) and two for twelve inch targets (one for each of two spacings). Note further that four insulator rings 36 are provided, two for ten inch targets and two for twelve inch targets, one for each of the RM and SPA types. Ten adapter shields 41 are provided, two for each of two materials for each of the five bodies. For twelve inch targets, different adapter shields are illustrated for two different target types, resulting in a total of twelve different adapter shields 41. Two sizes of dark space shields 40 are provided for each target size, one each for standard and one for high pressure. These are multiplied by the number of different materials desired, so that six dark space shields are provided for ten inch targets (where three materials are provided) and four for twelve inch targets (where two materials are provided).

Those skilled in the art will appreciate that the application of the present invention herein is varied, that the invention is described in exemplary embodiments, and that additions and modifications can be made without departing from the principles of the invention. Therefore, the following is claimed:

What is claimed is:

1. A method of providing adapter assemblies capable of mounting a sputtering cathode in mounting structure of a given geometry in a sputter coating apparatus and capable of supporting, in the mounting structure of the given geometry, a plurality of different cathode configurations of either a plurality of different target diameters, a plurality of different cathode materials or configurations, or at a plurality of different target-to-substrate spacings, the method comprising:

providing an annular adapter body having an outside surface configured to mount in the mounting structure of the given geometry, having an inside surface configured to support a cathode of one of said diameters, and having thickness geometry configured to support a cathode at one of said target-to-substrate spacings;

providing an annular electrical-insulator ring configured to support a cathode of one of the diameters and materials or configurations;

providing a replaceable annular adapter shield attachable to the outside surface of the body and configured to cover portions of the outer surface of the body to protect said portions of the body from deposits during sputtering, the adapter shield being removable from the body to remove from the assembly deposits that have accumulated thereon during sputtering; and providing a replaceable annular dark-space shield attachable to a side of the body that is configured to face the substrate, the dark-space shield being configured and dimensioned to cover a portion of the body facing the substrate and a portion of the body facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning;

the providing of the adapter body including providing a plurality of adapter bodies, each having the outside surface thereof configured to mount in the mounting structure of the given geometry, each body having either a) the inside surface thereof configured to support a cathode of a different one of said diameters, b) a different thickness geometry configured to support a cathode at a different one of said target-to-substrate spacings, or c) both the inside surface thereof configured to support a cathode of a different one of said diameters and a thickness geometry configured to support a cathode at a different one of said target-to-substrate spacings.

2. The method of the claim 1 wherein:
the providing of the adapter body includes providing a plurality of adapter bodies, each having the outside surface thereof configured to mount in the mounting structure of the given geometry, each body having the inside surface thereof configured to support a cathode of a different one of said diameters.

3. The method of claim 1 wherein:
the providing of the adapter body includes providing a plurality of adapter bodies, each having the outside surface thereof configured to mount in the mounting structure of the given geometry and each having a different thickness geometry configured to support a cathode at a different one of said target-to-substrate spacings.

4. The method of claim 1 wherein:
the providing of the adapter body includes providing a plurality of adapter bodies, each having the outside surface thereof configured to mount in the mounting structure of the given geometry and each having the inside surface thereof configured to support a cathode of a different one of said diameters and a thickness geometry configured to support a cathode at a different one of said target-to-substrate spacings.

5. A method of providing adapter assemblies capable of mounting a sputtering cathode in mounting structure of a given geometry in a sputter coating apparatus and capable of supporting, in the mounting structure of the given geometry, a plurality of different cathode configurations of either a plurality of different target diameters, a plurality of different cathode materials or configurations, or at a plurality of different target-to-substrate spacings, the method comprising:

providing an annular adapter body having an outside surface configured to mount in the mounting structure of the given geometry, having an inside surface configured to support a cathode of one of said diameters, and having thickness geometry configured to support a cathode at one of said target-to-substrate spacings;

providing an annular electrical-insulator ring configured to support a cathode of one of the diameters and materials or configurations;

providing a replaceable annular adapter shield attachable to the outside surface of the body and configured to cover portions of the outer surface of the body to protect said portions of the body from deposits during sputtering, the adapter shield being removable from the body to remove from the assembly deposits that have accumulated thereon during sputtering; and providing a replaceable annular dark-space shield attachable to a side of the body that is configured to face the substrate, the dark-space shield being configured and dimensioned to cover a portion of the body facing the substrate and a portion of the body facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning;

the providing of the electrical-insulator ring includes providing a plurality of rings, each configured to support the cathode of different ones of the diameters or of the materials or configurations in an adapter body configured for any of the plurality of the spacings.

6. The method of claim 5 wherein:

the providing of the electrical-insulator ring includes providing a plurality of rings, each configured to support a cathode assembly of a different one of the materials or configurations.

7. The method of claim 5 wherein:

the providing of the electrical-insulator ring includes providing a plurality of rings, each configured to support a cathode assembly of a different one of the diameters.

8. The method of claim 5 wherein:

the providing of the electrical-insulator ring includes providing a plurality of rings, each configured to support the cathode of a different combination of the diameters and materials or configurations in an adapter body at any of the plurality of spacings.

9. A method of providing adapter assemblies capable of mounting a sputtering cathode in mounting structure of a given geometry in a sputter coating apparatus and capable of supporting, in the mounting structure of the given geometry, a plurality of different cathode configurations of either a plurality of different target diameters, a plurality of different cathode materials or configurations, or at a plurality of different target-to-substrate spacings, the method comprising:

providing an annular adapter body having an outside surface configured to mount in the mounting structure of the given geometry, having an inside surface configured to support a cathode of one of said diameters, and having thickness geometry configured to support a cathode at one of said target-to-substrate spacings;

providing an annular electrical-insulator ring configured to support a cathode of one of the diameters and materials or configurations;

providing a replaceable annular adapter shield attachable to the outside surface of the body and configured to cover portions of the outer surface of the body to protect said portions of the body from deposits during sputtering, the adapter shield being removable from the body to remove from the assembly deposits that have accumulated thereon during sputtering; and providing a replaceable annular dark-space shield attachable to a side of the body that is configured to face the substrate, the dark-space shield being configured and dimensioned to cover a portion of the body facing the substrate and a portion of the body facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning;

the providing of the dark-space shield includes providing a plurality of dark space shields configured to provide said gap around the cathode of one of the materials or configurations and diameters to protect an adapter body of any of the plurality of spacings.

10. The method of claim 9 wherein:

the providing of the dark-space shield includes providing a plurality of dark space shields, each configured to provide said gap around a cathode assembly of a different one of the materials or configurations.

11. The method of claim 9 wherein:

the providing of the dark-space shield includes providing a plurality of dark space shields, each configured to provide said gap around a cathode assembly of a different one of the diameters.

12. The method of claim 9 wherein:

the providing of the dark-space shield includes providing a plurality of dark space shields, each configured to provide said gap around a cathode assembly of one of the diameters and materials at different process pressures.

13. The method of claim 9 wherein:

the providing of the dark-space shield includes providing a plurality of dark space shields, each configured to provide said gap around a cathode assembly for different materials.

14. The method of claim 9 wherein:

the providing of the dark-space shield includes providing a plurality of dark space shields, each configured to provide said gap around a cathode of a different one of the diameters and materials or configurations and any of the plurality of spacings.

15. The method of claim 9 wherein:

the providing of the dark-space shield includes providing a dark space shield configured to provide said gap of from 0.062+/−0.005 inches for pressure in a range of approximately 2.0 to 3.0 milli-Torr and 0.050+/−0.005 inches for pressure in a range of approximately 10.0–15.0 mTorr.

16. The method of claim 9 wherein:

the providing of the dark-space shield includes providing a dark-space shield configured to provide a gap of at least 0.045 inches.

17. An adapter assembly capable of mounting a sputtering cathode in a mounting structure of a given geometry in a sputter coating apparatus and capable of providing a plurality of different cathode configurations of either a plurality of different cathodes, a plurality of different target diameters, a plurality of different cathode or target materials or configurations, or a plurality of different target-to-substrate spacings, the assembly comprising:

an annular adapter body having an outside surface configured to mount in the mounting structure of the given geometry, having an inside surface configured to support a cathode of one of said diameters, and having thickness geometry configured to support a cathode at one of said target-to-substrate spacings;

an annular electrical-insulator ring configured to support a cathode of one of the diameters and materials or configurations;

a replaceable annular adapter shield attachable to the outside of the body and configured to cover portions of the outer surface of the body to protect said portions of the body from deposits during sputtering, the shield being removable from the body to remove from the assembly deposits that have accumulated thereon during sputtering; and a replaceable annular dark-space shield attachable to a side of the body that is configured to face the substrate, the dark-space shield being configured and dimensioned to cover a portion of the body facing the substrate and a portion thereof facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap between the target on the one hand and the shield and insulator on the other hand that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator, so as to facilitate use of the target substantially for the life of the target without interruption necessitated by a need to subject the adaptor assembly or parts thereof to removal for replacement or cleaning;

the adapter body including a plurality of adapter bodies, each having the outside surface thereof configured to mount in the mounting structure of the given geometry, each body having either a) the inside surface thereof configured to support a cathode of a different one of said diameters, b) a different thickness geometry configured to support a cathode at a different one of said target-to-substrate spacings, or c) both the inside surface thereof configured to support a cathode of a different one of said diameters and a thickness geometry configured to support a cathode at a different one of said target-to-substrate spacings.

18. The assembly of the claim 17 wherein:
each of the plurality of adapter bodies has its outside surface configured to mount in a fixed size opening, each body having the inside surface configured to support a cathode of a different one of said diameters.

19. The assembly of the claim 17 wherein:
each of the plurality of adapter bodies has its outside surface configured to mount in a fixed size opening, each body having a different thickness geometry configured to support a cathode at a different one of said target-to-substrate spacings.

20. The assembly of the claim 17 wherein:
each of the plurality of adapter bodies has its outside surface configured to mount in the mounting structure of the given geometry, each body having the inside surface configured to support a cathode of a different one of said diameters, each body having thickness geometry configured to support a cathode at one of said target-to-substrate spacings.

21. The assembly of the claim 17 further comprising:
a plurality of rings, each configured to support a cathode assembly of a different one of the materials or configurations, each ring configured to support the cathode of a different combination of the diameters and materials or configurations in an adapter body at any of a plurality of the spacings;

a plurality of adapter shields, one for each of a plurality of different combinations of target-to-substrate spacing geometries of the body and target diameter configuration capabilities of the body; and a plurality of dark space shields, each configured to provide said gap around a cathode of a different one of the diameters and materials or configurations and to so protect an adapter body of any of a plurality of the spacings.

22. An adapter assembly capable of mounting a sputtering cathode in a mounting structure of a given geometry in a sputter coating apparatus and capable of providing a plurality of different cathode configurations of either a plurality of different cathodes, a plurality of different target diameters, a plurality of different cathode or target materials or configurations, or a plurality of different target-to-substrate spacings, the assembly comprising:

an annular adapter body having an outside surface configured to mount in the mounting structure of the given geometry, having an inside surface configured to support a cathode of one of said diameters, and having thickness geometry configured to support a cathode at one of said target-to-substrate spacings;

an annular electrical-insulator ring configured to support a cathode of one of the diameters and materials or configurations;

a replaceable annular adapter shield attachable to the outside of the body and configured to cover portions of the outer surface of the body to protect said portions of the body from deposits during sputtering, the shield being removable from the body to remove from the assembly deposits that have accumulated thereon during sputtering; and a replaceable annular dark-space shield attachable to a side of the body that is configured to face the substrate, the dark-space shield being configured and dimensioned to cover a portion of the body facing the substrate and a portion thereof facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap between the target on the one hand and the shield and insulator on the other hand that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator, so as to facilitate use of the target substantially for the life of the target without interruption necessitated by a need to subject the adaptor assembly or parts thereof to removal for replacement or cleaning;

the dark-space shield includes a plurality of dark space shields each configured to provide said gap around the cathode of one of the diameters and materials or configurations and to so protect an adapter body of any of a plurality of the spacings.

23. The assembly of the claim 22 wherein:
each dark space shield of the plurality of dark space shields is configured to provide said gap around a cathode assembly of a different one of the materials or configurations or diameters.

24. An adapter assembly capable of mounting a sputtering cathode in a mounting structure of a given geometry in a sputter coating apparatus and capable of providing a plurality of different cathode configurations of either a plurality of different cathodes, a plurality of different target diameters, a plurality of different cathode or target materials or configurations, or a plurality of different target-to-substrate spacings, the assembly comprising:
an annular adapter body having an outside surface configured to mount in the mounting structure of the given geometry, having an inside surface configured to support a cathode of one of said diameters, and having thickness geometry configured to support a cathode at one of said target-to-substrate spacings;
an annular electrical-insulator ring configured to support a cathode of one of the diameters and materials or configurations;
a replaceable annular adapter shield attachable to the outside of the body and configured to cover portions of the outer surface of the body to protect said portions of the body from deposits during sputtering, the shield being removable from the body to remove from the assembly deposits that have accumulated thereon during sputtering; and
a replaceable annular dark-space shield attachable to a side of the body that is configured to face the substrate, the dark-space shield being configured and dimensioned to cover a portion of the body facing the substrate and a portion thereof facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap between the target on the one hand and the shield and insulator on the other hand that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator, so as to facilitate use of the target substantially for the life of the target without interruption necessitated by a need to subject the adaptor assembly or parts thereof to removal for replacement or cleaning;
a plurality of rings, each configured to support a cathode assembly of a different one of the materials or configurations, each ring configured to support the cathode of a different combination of the diameters and materials or configurations in an adapter body at any of a plurality of the spacings.

25. The assembly of the claim 24 wherein:
each ring of the plurality is configured to support the cathode of one of the diameters and one of the materials or configurations in an adapter body at any of a plurality of the spacings.

26. The assembly of the claim 24 further comprising:
each ring of the plurality is configured to support a cathode assembly of a different one of the materials or configurations or a different one of the diameters.

27. An adapter assembly capable of mounting a sputtering cathode in a mounting structure of a given geometry in a sputter coating apparatus and capable of providing a plurality of different cathode configurations of either a plurality of different cathodes, a plurality of different target diameters, a plurality of different cathode or target materials or configurations, or a plurality of different target-to-substrate spacings, the assembly comprising:
an annular adapter body having an outside surface configured to mount in the mounting structure of the given geometry, having an inside surface configured to support a cathode of one of said diameters, and having thickness geometry configured to support a cathode at one of said target-to-substrate spacings;
an annular electrical-insulator ring configured to support a cathode of one of the diameters and materials or configurations;
a replaceable annular adapter shield attachable to the outside of the body and configured to cover portions of the outer surface of the body to protect said portions of the body from deposits during sputtering, the shield being removable from the body to remove from the assembly deposits that have accumulated thereon during sputtering; and
a replaceable annular dark-space shield attachable to a side of the body that is configured to face the substrate, the dark-space shield being configured and dimensioned to cover a portion of the body facing the substrate and a portion thereof facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap between the target on the one hand and the shield and insulator on the other hand that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator, so as to facilitate use of the target substantially for the life of the target without interruption necessitated by a need to subject the adaptor assembly or parts thereof to removal for replacement or cleaning;
the replaceable adapter shield includes a plurality of adapter shields, one for each of a plurality of different combinations of target-to-substrate spacing geometries of the body and target diameter configuration capabilities of the body.

28. A method of protecting an insulator ring that supports a sputtering target in an adapter body in a sputter coating apparatus, the method comprising:
installing a dark-space shield of a given geometry or replacing an existing dark-space shield of the same or a different geometry, around a target in a sputter coating apparatus, wherein the dark-space shield has a generally cylindrical inwardly facing surface and the target has a generally cylindrical outwardly facing edge surface; and securing the dark-space shield around the target with the inwardly facing surface thereof parallel to and concentric with the outwardly facing edge surface of the target and spaced at least 0.045 inches therefrom and at most 0.067 inches therefrom.

29. The method of the claim 28 wherein: the dark-space shield is secured around the target with the inwardly facing surface thereof spaced 0.050+/−0.005 inches therefrom.

30. The method of the claim 28 wherein:
the dark-space shield is secured around the target with the inwardly facing surface thereof spaced 0.062+/−0.005 inches therefrom.

31. The method of the claim 28 wherein:
the inwardly facing surface of the dark-space shield has an inside diameter of 11.749+/−0.005 inches.

32. The method of the claim 28 wherein:
the inwardly facing surface of the dark-space shield has an inside diameter of 11.725+/−0.005 inches.

33. The method of the claim 28 wherein:
the inwardly facing surface of the dark-space shield has an inside diameter of 10.124+/−0.005 inches.

34. The method of the claim 28 wherein:
the inwardly facing surface of the dark-space shield has an inside diameter of 10.100+/−0.005 inches.

35. A method of providing an adapter assembly capable of mounting a cathode assembly including a target in a sputter coating apparatus and forming a plasma chamber therein, the method comprising:
providing an annular adapter body having a cylindrical cavity therein, an outer flange configured to couple to the sputter coating apparatus, and an inner shoulder configured to couple to the cathode assembly;
providing a replaceable annular insulator ring, the annular insulator ring physically coupling the cathode assembly to the inner shoulder and electrically insulating the cathode assembly from the inner shoulder; and
providing a replaceable annular dark space shield configured to be coupled to a lower surface of the inner shoulder, the dark space shield being dimensioned and configured to cover the lower surface of the inner shoulder, an inner radial surface of the inner shoulder, and an inner radial surface of the insulator ring, wherein the dark space shield and the target are separated by a gap of at least 0.045 inches.

36. The method of claim 35 comprising:
providing a replaceable annular adapter shield configured to be coupled to a mating surface of the adapter body, the adapter shield being dimensioned and configured to cover a portion of the dark space shield, an outer radial surface of the adapter body, and the mating surface of the adapter body, wherein a gap is provided between the dark space shield and the cathode assembly.

37. In a method of mounting a cathode assembly to the sputter coating apparatus having a sputtering chamber, the cathode assembly having a plurality of different cathode configurations of either a plurality of different target diameters, a plurality of different cathode materials or configurations, or at a plurality of different target-to-substrate spacings, the improvement comprising:
providing an annular adapter body having an outside surface configured to mount in the mounting structure of the sputter coating apparatus, having an inside surface configured to support the cathode assembly having the plurality of different cathode configurations;
providing an annular electrical-insulator ring configured to support at least one of the cathodes of one of the diameters and materials or configurations;
providing a replaceable annular adapter shield attachable to the outside surface of the the body from deposits during sputtering, the adapter shield being removable from the body to remove from the assembly deposits that have accumulated thereon during sputtering; and
providing a replaceable annular dark-space shield attachable to a side of the body that is configured to face the sputtering chamber, the dark-space shield being configured and dimensioned to cover a portion of the body facing the sputtering chamber and a portion of the body facing radially-inwardly toward the target to protect the portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning;
the providing of at least one of the annular adapter body, the annular electrical insulator ring, the replaceable annular adapter shield or the replaceable annular dark-space shield including the selecting of the body, ring, or shield from among a plurality thereof having different configurations.

38. The method of claim 37 further comprising:
providing a replaceable annular adapter shield configured to be coupled to a mating surface of the adapter body, the adapter shield being dimensioned and configured to cover a portion of the dark space-shield, an outer radial surface of the adapter body, and the mating surface of the adapter body, wherein a gap is provided between the dark space shield and the cathode assembly.

39. In a sputter coating apparatus, the improvement comprising:
an adapter assembly for mounting the cathode assembly to the sputter coating apparatus having a sputtering chamber, the cathode assembly having a plurality of different cathode configurations of either a plurality of different target diameters, a plurality of different cathode materials or configurations, or at a plurality of different target-to-substrate spacings, wherein the adapter assembly comprises:
an annular adapter body having an outside surface configured to mount in the mounting structure of the sputter coating apparatus, having an inside surface configured to support the cathode assembly having the plurality of different cathode configurations;
an annular electrical-insulator ring coupled to the adapter body and configured to support at least one of the cathodes of one of the diameters and materials or configurations;
a replaceable annular adapter shield coupled to the outside surface of the adapter body and configured to cover portions of the outer surface of the body to protect the portions of the body from deposits during sputtering, the adapter shield being removable from the body to remove from the assembly deposits that have accumulated thereon during sputtering; and a replaceable annular dark-space shield coupled to a side of the body that is configured to face the sputtering chamber, the dark-space shield being configured and dimensioned to cover a portion of the body facing the sputtering chamber and a portion of the body facing radially-inwardly toward the target to protect the portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning.

40. A method of providing adapter assemblies capable of mounting a sputtering cathode in mounting structure of a given geometry in a sputter coating apparatus and capable of supporting, in the mounting structure of the given geometry, a plurality of different cathode configurations of either a plurality of different target diameters, a plurality of different cathode materials or configurations, or at a plurality of different target-to-substrate spacings, the method comprising:

providing an annular adapter body having an outside surface configured to mount in the mounting structure of the given geometry, having an inside surface configured to support a cathode of one of said diameters, and having thickness geometry configured to support a cathode at one of said target-to-substrate spacings;

providing an annular electrical-insulator ring configured to support a cathode of one of the diameters and materials or configurations;

providing a replaceable annular adapter shield attachable to the outside surface of the body and configured to cover portions of the outer surface of the body to protect said portions of the body from deposits during sputtering, the adapter shield being removable from the body to remove from the assembly deposits that have accumulated thereon during sputtering; and providing a replaceable annular dark-space shield attachable to a side of the body that is configured to face the substrate, the dark-space shield being configured and dimensioned to cover a portion of the body facing the substrate and a portion of the body facing radially-inwardly toward the target to protect said portions of the body from deposits during sputtering, the dark-space shield being removable from the body to remove, from the assembly, deposits that have accumulated thereon during sputtering, the dark-space shield having an inside surface configured to form a gap, between the target and the dark space shield and the target and the insulator, that is wide enough to prevent a spark between the target and the dark-space shield and narrow enough to prevent the formation of plasma between the target and the dark-space shield or the insulator, the gap having a depth that is sufficiently large relative to the width thereof to avoid substantial deposition of sputtering material on the insulator to facilitate use of the target substantially for the life of the target without interruption necessitated by a need to subject the adaptor assembly or parts thereof to removal for replacement or cleaning;

the providing of a replaceable adapter shield includes providing a plurality of adapter shields, one for each of a plurality of different target-to-substrate spacing geometries of the body or one for each of a plurality of different target diameter configuration capabilities of the body.

41. The method of claim 40 wherein:

the providing of a replaceable adapter shield includes providing a plurality of adapter shields, one for each of a plurality of different target-to-substrate spacing geometries of the body.

42. The method of claim 40 wherein:

the providing of a replaceable adapter shield includes providing a plurality of adapter shields, one for each of a plurality of different target diameter configuration capabilities of the body.

43. The method of the claim 40 wherein:

the providing of the adapter body includes providing a plurality of adapter bodies, each having the outside surface configured to mount in the mounting structure of the given geometry, each having the inside surface configured to support a cathode of a different combination of said diameters and each having a thickness geometry configured to support a cathode at a different one of said target-to-substrate spacings;

the providing of the ring includes providing a plurality of rings, each ring configured to support the cathode of a different combination of the diameters and materials or configurations in an adapter body at any of a plurality of the spacings;

the providing of a replaceable adapter shield includes providing a plurality of adapter shields, one for each of a plurality of different combinations of target-to-substrate spacing geometries of the body and target diameter configuration capabilities of the body; and the providing of the dark-space shield includes providing a plurality of dark space shields, each configured to provide said gap around a cathode of a different one of the diameters and materials or configurations for a given processing pressure, and to so protect an adapter body of any of the plurality of target-to-substrate spacing geometries.

44. The method of claim 40 wherein:

the providing of a replaceable adapter shield includes providing a plurality of adapter shields, one for each of a plurality of different combinations of target-to-substrate spacing geometries of the body and target diameter configuration capabilities of the body.

* * * * *

UNITED STATES PATENT AND TRADEMARK OFFICE
CERTIFICATE OF CORRECTION

PATENT NO. : 6,998,033 B2
APPLICATION NO. : 10/438304
DATED : February 14, 2006
INVENTOR(S) : John Lawson et al.

It is certified that error appears in the above-identified patent and that said Letters Patent is hereby corrected as shown below:

Column 11, line 26 reads "...654, For example, slot 654 can have a width of 0.5 inches,..." and should read – ...654. For example, slow 654 can have a width of 0.5 inches,... –.

Column 14 line 29 reads "...dark space shield 40$a$ can be have its surface roughened and..." and should read – ...dark space shield 40$a$ can have its surface roughened and...–.

Column 14, line 66 reads "...adapter shield 41$a$ can be have its surface roughened and a..." and should read – ... adapter shield 41$a$ can have its surface roughened and a ...–.

Column 15, line 56 reads "...surface 1230$b$ of the inner shoulder 1230 can have an inside..." and should read – ... surface 1230$b$ of the inner shoulder 1230, can have an inside ...–.

Column 15, line 61 reads "...1254, For example, slot 1254 can have a width of at least 0.5..." and should read – ...1254. For example, slot 1254 can have a width of at least 0.5...–.

Column 18, line 23 reads "...invention. Dark space shield 40' comprises top ring 1610,..." and should read – ... invention. Dark space shield 40$a$' comprises top ring 1610,...–.

Column 18, line 50 reads "...dark space shield 40$a$' can be have its surface roughened and..." and should read – ...dark space shield 40$a$' can have its surface roughened and...–.

Column 27, CLAIM 29, lines 6-8 read, "29. The method of the claim 28 wherein: the dark-space shield is secured around the target with the inwardly facing surface thereof spaced 0.050+/-0.005 inches therefrom." and should read –

29. The method of the claim 28 wherein:

the dark-space shield is secured around the target with the inwardly   facing surface thereof spaced 0.050+/-0.005 inches therefrom.–. (missing paragraph/indent)

UNITED STATES PATENT AND TRADEMARK OFFICE
CERTIFICATE OF CORRECTION

PATENT NO. : 6,998,033 B2
APPLICATION NO. : 10/438304
DATED : February 14, 2006
INVENTOR(S) : John Lawson, Dale Irwin, Steve Chervenak and John McIntee It is certified that error appears in the above-identified patent and that said Letters Patent is hereby corrected as shown below:

Column 28, CLAIM 37, lines 1-5 read, "...providing a replaceable annular adapter shield attachable to the outside surface of the the body from deposits during sputtering, the adapter shield being removable from the body to remove from the assembly deposits that have accumulated thereon during sputtering; and..." and should read – ...providing a replaceable annular adapter shield attachable to the outside surface of the body and configured to cover portions of the outer surface of the body to protect said portions of the body from deposits during sputtering, the adapter shield being removable from the body to remove from the assembly deposits that have accumulated thereon during sputtering; and... –.

Column 28, CLAIM 38, line 39 reads, "...cover a portion of the dark space-shield, an outer radial..." and should read – ...cover a portion of the dark-space shield, an outer radial...–.

Signed and Sealed this

Twenty-ninth Day of August, 2006

JON W. DUDAS
*Director of the United States Patent and Trademark Office*